(12) United States Patent
Kunikiyo

(10) Patent No.: US 6,500,720 B2
(45) Date of Patent: Dec. 31, 2002

(54) METHOD OF MANUFACTURING SEMICONDUCTOR DEVICE

(75) Inventor: Tatsuya Kunikiyo, Tokyo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/961,369

(22) Filed: Sep. 25, 2001

(65) Prior Publication Data

US 2002/0137297 A1 Sep. 26, 2002

(30) Foreign Application Priority Data

Mar. 22, 2001 (JP) ........................................ 2001-082484

(51) Int. Cl.$^7$ ............................................. H01L 21/336
(52) U.S. Cl. ........................................ 438/305; 438/231
(58) Field of Search ................................. 438/162, 231, 438/305

(56) References Cited

U.S. PATENT DOCUMENTS

| | | | | |
|---|---|---|---|---|
| 5,508,227 A | * | 4/1996 | Chan et al. | 438/798 |
| 5,534,445 A | * | 7/1996 | Tran et al. | 438/162 |
| 5,563,093 A | * | 10/1996 | Koda et al. | 438/231 |
| 5,620,906 A | * | 4/1997 | Yamaguchi et al. | 438/162 |
| 6,107,147 A | | 8/2000 | Kim et al. | |
| 6,274,439 B1 | * | 8/2001 | Ito | 438/278 |
| 6,281,055 B1 | * | 8/2001 | Yang | 438/151 |
| 6,303,483 B1 | | 10/2001 | Kunikiyo | |

FOREIGN PATENT DOCUMENTS

JP    10-83980    3/1998

* cited by examiner

Primary Examiner—David Nelms
Assistant Examiner—Thao Le
(74) Attorney, Agent, or Firm—Oblon, Spivak, McClelland, Maier & Neustadt, P.C.

(57) ABSTRACT

Hydrogen ions (40) of high concentration are implanted into an amorphous silicon film (21). By implantation of the hydrogen ions (40), a hydrogen-ion implantation layer (41) is formed in the amorphous silicon film (21). Subsequently, by performing a heat treatment, a columnar grain is formed in a portion of the amorphous silicon film (21) other than the portion in which the hydrogen-ion implantation layer (41) is formed. On the other hand, in the hydrogen-ion implantation layer (41), a granular grain is formed. A granular grain layer (42) has a lot of grain boundaries extending multidirectionally, such as a grain boundary extending along a direction of film thickness of a polysilicon film (44a) and a grain boundary extending along a direction other than that of film thickness of the polysilicon film (44a). Thus, it is possible to achieve a method of manufacturing a semiconductor device which can appropriately suppress variation in threshold voltage which is caused by penetration of dopant.

17 Claims, 18 Drawing Sheets

METHOD OF MANUFACTURING SEMICONDUCTOR DEVICE

BACKGROUND OF THE INVENTION

1. Field of the Invention

The present invention relates to a method of manufacturing a semiconductor device and a structure of a semiconductor device, and more particularly to a method of manufacturing a MOSFET (Metal Oxide Semiconductor Field Effect Transistor) and a structure thereof.

2. Description of the Background Art

With miniaturization of semiconductor devices, a technique of forming a metal silicide for use in gate, source and drain has been in actual use as one of attempts to increase drain currents of a MOSFET for high-speed operation of circuits. A characteristic feature of the metal silicide lies in its lower resistance value than that of a doped polysilicon. In order to form the metal silicide, a refractory metal film is deposited on a silicon and then a heat treatment such as RTA (Rapid Thermal Annealing) is performed to react the silicon with the refractory metal film. Forming the metal silicide for use in the gate, source and drain lowers the resistance values of the respective regions, thereby increasing the drain currents.

Among kinds of metal suicides well known are a titanium silicide ($TiSi_2$), a tungsten silicide ($WSi_2$), a nickel silicide (NiSi), a platinum silicide (PtSi), a cobalt silicide ($CoSi_2$) and the like. Among them, it is known that even when used in a fine gate electrode whose gate length is 0.1 μm or less, the cobalt silicide can lower the resistance of the gate electrode. On the other hand, it is known that when used in a gate electrode whose gate length is 0.15 μm or less, the tungsten silicide increases the resistance of the gate electrode by the linewidth effect. The cobalt silicide, nickel silicide or platinum silicide does not have the linewidth effect.

Now, reaction of cobalt (Co) with silicon (Si) will be discussed. At 400° C., Co begins to react with Si, thereby forming a $Co_2Si$, and the sheet resistance gradually becomes higher. At 450 to 500° C., a CoSi is formed and the sheet resistance becomes maximum. Over 600° C., a $CoSi_2$ is formed and the sheet resistance becomes lower.

In the process of forming the cobalt silicide, first, a first RTA is performed at 450 to 600° C. Next, an unreacted Co is removed and then a second RTA is performed at 650 to 800° C. to lower the sheet resistance. Further, when the temperature for the second RTA rises up to 900° C., as the Co in the metal silicide is diffused into a silicon substrate, reaching the vicinity of a pn junction of source/drain regions, the amount of leakage currents increases.

FIG. 28 is a cross section showing a structure of a general-type MOSFET in which the cobalt silicide is formed. In an upper surface of a silicon substrate 101, an STI (Shallow Trench Isolation) 102 is selectively formed. On the upper surface of the silicon substrate 101, a gate electrode 104 is selectively formed with a gate insulating film 103 interposed therebetween. On the gate electrode 104, a cobalt silicide 106 is formed. Further, in the upper surface of the silicon substrate 101 formed are source/drain regions 111 which are paired with a channel region which is formed below the gate electrode 104 interposed therebetween, being in contact with side surfaces of the STI 102. On the source/drain regions 111, cobalt silicide layers 112 are formed. On side surfaces of the gate electrode 104, sidewalls 109 are formed with first and second offset films 107 and 108 interposed therebetween.

The reaction of silicidation proceeds through diffusion of refractory metal towards the silicon. Therefore, as shown in FIG. 28, the cobalt intrudes into an interface between the second offset film 108 and the silicon substrate 101, to form an intruding portion 114 of the cobalt silicide layer 112. Further, the cobalt intrudes into an interface between the STI 102 and the silicon substrate 101, to form an intruding portion 115 of the cobalt silicide layer 112.

With miniaturization of the semiconductor devices, when the width of the sidewall 109 becomes 10 nm or less, the intruding portion 114 of the cobalt silicide layer 112 reaches the gate insulating film 103 and the amount of leakage currents at the gate thereby increases. Further, when the depth of the pn junction formed at an interface between the source/drain region 111 and the silicon substrate 101 becomes shallower than the depth of 0.05 μm from the upper surface of the silicon substrate 101, the intruding portion 115 of the cobalt silicide layer 112 reaches a depletion layer of the pn junction and the amount of leakage currents at the source and drain thereby increases.

Furthermore, in a reaction process of silicidation, the metal silicide sometimes abnormally grows like a spike due to a stress in the phase transition of crystal, and the like. In FIG. 28 shown is an abnormally-grown spike 113 of the cobalt silicide. The cobalt silicide abnormally grows at the temperature of 400 to 450° C., to form the spike 113. With miniaturization of the semiconductor devices, when the depth of the pn junction formed at the interface between the source/drain region 111 and the silicon substrate 101 becomes shallower than the depth of 0.1 μm from the upper surface of the silicon substrate 101, the spike 113 reaches the depletion layer of the pn junction and the amount of leakage currents at the source and drain thereby increases.

As one of methods for suppressing generation of the spike which is caused by abnormal growth of the cobalt silicide well known is a preamorphization method. In this method, nitrogen or germanium is ion-implanted to amorphize the silicon substrate in advance before a cobalt film is deposited, and then the cobalt silicide is formed. Preamorphization of the silicon substrate relieves a stress caused at an interface between the silicide and the silicon on reaction, to suppress generation of the spike.

FIGS. 29 to 35 are cross sections showing a method of manufacturing an N-type MOSFET by the preamorphization method in the background art step by step. Referring to FIG. 29, first, the STI 102 is selectively formed in the upper surface of the silicon substrate 101. Subsequently, ion implantation is performed to form a well, a channel stopper layer and a channel dope layer (all not shown). Next, a silicon oxide film 120 is formed on the upper surface of the silicon substrate 101. Subsequently, an amorphous silicon film 121 is entirely deposited by the CVD (Chemical Vapor Deposition) method. Then, phosphorus ions 122 are implanted into the amorphous silicon film 121 by ion implantation.

Referring to FIG. 30, in the next step, the amorphous silicon film 121 and the silicon oxide film 120 are patterned by photolithography and anisotropic dry etching, to form the gate electrode 104 and the gate insulating film 103. Subsequently, a silicon-oxide-based insulating film such as a TEOS (Tetra Ethyl Ortho Silicate) film 123 is entirely deposited by the CVD method. With the temperature at this deposition, the amorphous silicon of the gate electrode 104 begins to become polysilicon (i.e., polycrystallize).

Referring to FIG. 31, in the next step, the TEOS film 123 is anisotropically etched, to form the first offset films 107 on the side surfaces of a gate structure consisting of the gate insulating film 103 and the gate electrode 104. Subsequently, arsenic ions 124 are implanted, to form extension regions 110 in the upper surface of the silicon substrate 101. Further, boron ions 125 are implanted, to form a pocket implantation region (not shown) in the silicon substrate 101. Forming the first offset film 107 is intended to protect the gate insulating film 103 in the ion implantation, to reduce variation in threshold voltage by increasing the effective channel length Leff and reduce the capacitance (gate overlap capacitance) formed between the gate electrode 104 and the extension region 110. Further, forming the pocket implantation region relieves roll-off of the threshold voltage and also suppresses occurrence of surface punch through. The arsenic ions 124 and the boron ions 125 are also implanted into the gate electrode 104.

Referring to FIG. 32, in the next step, a TEOS film 126 and a silicon nitride film 127 are entirely deposited in this order by the CVD method. With the temperature of this deposition, change of the gate electrode 104 into polysilicon further proceeds.

Referring to FIG. 33, in the next step, the silicon nitride film 127 and the TEOS film 126 are anisotropically etched, to form the sidewalls 109 and the second offset films 108. Subsequently, arsenic ions 128 are implanted, to form the source/drain regions 111. The arsenic ions 128 are also implanted into the gate electrode 104. Subsequently, in order to electrically activate the arsenic ions 124 and 128 and the boron ions 125, an RTA is performed at 1100° C. With this heat treatment, the silicon substrate 101 is recovered from defects caused by the ion implantation. Further, with this heat treatment, a columnar grain having a grain boundary 105 which extends along a direction of film thickness of the gate electrode 104 is formed in the gate electrode 104.

Referring to FIG. 34, in the next step, in order to amorphize upper surfaces of the source/drain regions 111, in other words, for the above-discussed preamorphization, germanium ions (not shown) are implanted. Subsequently, by sputtering under an argon atmosphere, for example, a native oxide film (not shown) formed on the surfaces of the source/drain regions 111 is removed. Removing the native oxide film is intended to avoid an increase in resistance value of the metal silicide due to the presence of the native oxide film. Next, a cobalt film 129 and a titanium nitride film 130 are entirely deposited in this order. Forming the titanium nitride film 130 is intended to prevent an increase in sheet resistance through natural oxidation of the cobalt film 129, mixing of oxygen into the cobalt film 129 during conveyance of wafers and processing in the device, and the like.

Referring to FIG. 35, in the next step, the first RTA is performed at 400° C. Subsequently, the titanium nitride film 130 and the unreacted cobalt film 129 are removed and then the second RTA is performed at 700° C. An upper surface of the gate electrode 104 is thereby silicified to form the cobalt silicide layer 106 and the upper surfaces of the source/drain regions 111 are silicified to form the cobalt silicide layers 112.

The above-discussed method of manufacturing a MOSFET in the background art, however, has the following problems.

The First Problem

As shown in FIG. 33, in the gate electrode 104 formed is the columnar grain having the grain boundary 105 which extends along the direction of film thickness of the gate electrode 104. Since the diffusion coefficient of a dopant diffused along the grain boundary is higher than that of a dopant diffused in the grain, the dopant introduced into the gate electrode 104 is diffused mainly along the grain boundary 105 to reach an interface between the gate electrode 104 and the gate insulating film 103. To suppress gate depletion, it is desired to activate more dopant in the vicinity of this interface. When the amount of dopant reaching the vicinity of this interface becomes too large, however, part of the dopant penetrates the gate insulating film 103 to reach the inside of the silicon substrate 101 and as a result, the threshold voltage of the MOSFET goes out of the designed value. This phenomenon is referred to as "penetration of dopant".

To suppress variation in threshold voltage which is caused by the penetration of dopant, it is necessary to reduce the amount of dopant reaching the interface between the gate electrode 104 and the gate insulating film 103 by some method. Anyway, it is necessary to ion-implant the dopant into the gate electrode 104 densely to such a degree that the polysilicon can degenerate. Accordingly, simple reduction in dose to be ion-implanted into the gate electrode 104 causes some problems, such as an increase in resistance value of the gate electrode 104 and deterioration in current driving capability which is caused by gate depletion. Therefore, simple reduction in dose for ion implantation can not be adopted.

Thus, the background-art method of manufacturing a MOSFET has the problem of not appropriately suppressing variation in threshold voltage which is caused by the penetration of dopant.

The Second Problem

As can be seen from comparison between FIGS. 28 and 35, in the background-art method of manufacturing a MOSFET using preamorphization, it is possible to avoid or suppress generation of any spike 113 due to abnormal growth of silicide. It is not possible, however, to avoid generation of the intruding portions 114 and 115 of the cobalt silicide layer 112 even by the preamorphization method.

Thus, in the background-art method of manufacturing a MOSFET, the intruding portions 114 and 115 of the cobalt silicide layer 112 are still formed. Therefore, this method has a problem of increasing leakage currents at the gate, source and drain as the size of a semiconductor device becomes smaller.

Further, in the step of FIG. 30, the amorphous silicon film 121 is anisotropically etched to form the gate electrode 104, and the gas used in the step of anisotropic etching is free radical, such as $CF_x$. Part of the free radical is accelerated by an electric field between a plasma sheath and a wafer in an etching device, to mix into the silicon substrate 101. The free radical which mixes into the silicon substrate 101 is dissociated into C atoms and F atoms through nuclear scattering caused by collision with silicon atoms. The F atoms become $F_2$ molecule by the heat treatment or become HF molecule through chemical bond with hydrogen atoms in the silicon substrate 101, volatilizing out of the silicon substrate 101. In contrast, the C atoms remain inside the silicon substrate 101, disadvantageously, becoming a source of leakage current.

Furthermore, when the metal silicide is formed in a narrow region of about 0.15 μm or less, the temperature required for phase transition from CoSi of high resistance to $CoSi_2$ of lower resistance rises. Therefore, the metal silicide is flocculated when heated to high temperature, about over 800° C., and the metal silicide is disadvantageously broken.

The Third Problem

To suppress the short-channel effect, there is a tendency of forming the extension regions 110 shallower in the upper surface of the silicon substrate 101. When the extension regions 110 are formed shallower, however, the sheet resistance becomes higher and accordingly the current driving capability of the MOSFET is disadvantageously deteriorated.

SUMMARY OF THE INVENTION

The present invention is directed to a method of manufacturing a semiconductor device. According to a first aspect of the present invention, the method of manufacturing a semiconductor device comprises the steps of: (a) preparing a semiconductor substrate; (b) forming a semiconductor film of amorphous substance on a main surface of the semiconductor substrate with an insulating film interposed therebetween; (c) introducing an impurity for lowering resistance into the semiconductor film; (d) introducing hydrogen ions or deuterium ions into the semiconductor film; (e) performing a heat treatment to polycrystallize the amorphous substance after the step (d); and (f) patterning the semiconductor film to form a gate electrode on the main surface of the semiconductor substrate with a gate insulating film interposed therebetween.

According to a second aspect of the present invention, in the method of manufacturing a semiconductor device of the first aspect further comprises the steps of: (g) selectively forming an isolation insulating film in the main surface of the semiconductor substrate; (h) introducing hydrogen ions or deuterium ions into the semiconductor substrate; (i) forming source/drain regions which are paired with the gate electrode interposed therebetween in the main surface of the semiconductor substrate within an element formation region defined by the isolation insulating film; and (j) forming metal-semiconductor compound layers on the source/drain regions.

According to a third aspect of the present invention, in the method of manufacturing a semiconductor device of the second aspect, the steps (d) and (h) are performed in the same process after the step (f).

According to a fourth aspect of the present invention, in the method of manufacturing a semiconductor device of any one of the first to third aspects further comprises the steps of: (k) forming extension regions which are paired with the gate electrode interposed therebetween in the main surface of the semiconductor substrate; and (l) forming semiconductor layers in which an impurity for lowering resistance is introduced on the extension regions.

According to a fifth aspect of the present invention, the method of manufacturing a semiconductor device comprises the steps of: (a) preparing a semiconductor substrate; (b) selectively forming an isolation insulating film in a main surface of the semiconductor substrate; (c) selectively forming a gate electrode on the main surface of the semiconductor substrate with a gate insulating film interposed therebetween within an element formation region defined by the isolation insulating film; (d) introducing hydrogen ions or deuterium ions into the semiconductor substrate; (e) forming source/drain regions which are paired with the gate electrode interposed therebetween in the main surface of the semiconductor substrate within the element formation region; and (f) forming metal-semiconductor compound layers on the source/drain regions.

According to a sixth aspect of the present invention, in the method of manufacturing a semiconductor device of the fifth aspect, the hydrogen ions or the deuterium ions are introduced at least in the vicinity of a corner defined by a bottom surface and a side surface of the isolation insulating film in the step (d).

According to a seventh aspect of the present invention, in the method of manufacturing a semiconductor device of the fifth aspect, the hydrogen ions or the deuterium ions are introduced at least in the vicinity of a corner defined by a side surface of the isolation insulating film and the main surface of the semiconductor substrate in the step (d).

According to an eighth aspect of the present invention, in the method of manufacturing a semiconductor device of the fifth aspect, the hydrogen ions or the deuterium ions are introduced in the main surface of the semiconductor substrate at least in the vicinity of an end portion of the gate electrode in the step (d).

According to a ninth aspect of the present invention, in the method of manufacturing a semiconductor device of any one of the fifth to eighth aspects, the step (f) has the steps of (f-1) forming metal films on the source/drain regions; and (f-2) performing a heat treatment to react the metal films with the source/drain regions, and wherein the heat treatment in the step (f-2) is performed under a hydrogen atmosphere or a deuterium atmosphere.

According to a tenth aspect of the present invention, the method of manufacturing a semiconductor device comprises the steps of: (a) preparing a semiconductor substrate; (b) selectively forming a gate structure on a main surface of the semiconductor substrate; (c) forming extension regions which are paired with the gate structure interposed therebetween in the main surface of the semiconductor substrate; and (d) forming semiconductor layers in which an impurity for lowering resistance is introduced on the extension regions.

According to an eleventh aspect of the present invention, in the method of manufacturing a semiconductor device of the tenth aspect further comprises the steps of: (e) introducing hydrogen ions or deuterium ions into the semiconductor layers; and (f) forming metal-semiconductor compound layers on the semiconductor layers after the step (e).

According to a twelfth aspect of the present invention, in the method of manufacturing a semiconductor device of the tenth or eleventh aspect further comprises the steps of: (g) forming sidewalls in contact with side surfaces of the gate structure after the step (d); and (h) ion-implanting an impurity into the semiconductor substrate with the gate structure and the sidewalls used as an implantation mask to form source/drain regions.

The present invention is also directed to a semiconductor device. According to a thirteenth aspect of the present invention, the semiconductor device comprises a semiconductor substrate; and a gate electrode of polycrystalline substance in which an impurity for lowering resistance is introduced, being selectively formed on a main surface of the semiconductor substrate with a gate insulating film interposed therebetween, and in the semiconductor device of the thirteenth aspect, the gate electrode includes a granular grain layer having a grain boundary not extending along a direction of film thickness of the gate electrode.

According to a fourteenth aspect of the present invention, the semiconductor device of the thirteenth aspect further comprises an isolation insulating film selectively formed in the main surface of the semiconductor substrate; a diffusion layer in which hydrogen or deuterium is diffused, being selectively formed in the semiconductor substrate; source/drain regions which are paired with the gate electrode interposed therebetween, being formed in the main surface of the semiconductor substrate within an element formation region defined by the isolation insulating film; and metal-semiconductor compound layers formed on the source/drain regions.

According to a fifteenth aspect of the present invention, the semiconductor device of the thirteenth or fourteenth aspect further comprises extension regions which are paired with the gate electrode interposed therebetween, being formed in the main surface of the semiconductor substrate; and semiconductor layers in which an impurity for lowering resistance is introduced, being formed on the extension regions.

According to a sixteenth aspect of the present invention, the semiconductor device comprises a semiconductor substrate; an isolation insulating film selectively formed in a main surface of the semiconductor substrate; a gate electrode selectively formed in the main surface of the semiconductor substrate with the gate insulating film interposed therebetween within an element formation region defined by the isolation insulating film; a diffusion layer in which hydrogen or deuterium is diffused, being selectively formed in the semiconductor substrate; source/drain regions which are paired with the gate electrode interposed therebetween, being formed in the main surface of the semiconductor substrate within the element formation region; and metal-semiconductor compound layers formed on the source/drain regions.

According to a seventeenth aspect of the present invention, in the semiconductor device of the sixteenth aspect, the diffusion layer is formed at least in the vicinity of a corner defined by a bottom surface and a side surface of the isolation insulating film.

According to an eighteenth aspect of the present invention, in the semiconductor device of the sixteenth aspect, the diffusion layer is formed at least in the vicinity of a corner defined by a side surface of the isolation insulating film and the main surface of the semiconductor substrate.

According to a nineteenth aspect of the present invention, in the semiconductor device of the sixteenth aspect, the diffusion layer is formed in the main surface of the semiconductor substrate at least in the vicinity of an end portion of the gate electrode.

According to a twentieth aspect of the present invention, the semiconductor device comprises a semiconductor substrate; a gate structure selectively formed in a main surface of the semiconductor substrate; extension regions which are paired with the gate structure interposed therebetween, being formed in the main surface of the semiconductor substrate; and semiconductor layers in which an impurity for lowering resistance is introduced, being formed on the extension regions.

According to a twenty-first aspect of the present invention, the semiconductor device of the twentieth aspect further comprises diffusion layers in which hydrogen or deuterium is diffused, being formed in the semiconductor layers; and metal-semiconductor compound layers formed on the semiconductor layers.

According to a twenty-second aspect of the present invention, the semiconductor device of the twentieth or twenty-first aspect further comprises sidewalls in contact with side surfaces of the gate structure, being formed on the semiconductor layers; and source/drain regions formed in a portion of the semiconductor substrate where neither the gate structure nor the sidewalls are formed.

In the method of the first aspect of the present invention, by introducing the hydrogen ions or the deuterium ions into the semiconductor film, a polycrystalline film at least partially having a granular grain layer can be formed through the heat treatment in the later step. The granular grain layer has a lot of grain boundaries extending multidirectionally, including a grain boundary not extending along the direction of film thickness of the polycrystalline film. Accordingly, the dopant introduced into the polycrystalline film is diffused multidirectionally along a lot of multidirectionally-extending grain boundaries in the granular grain layer. Therefore, the amount of dopant reaching an interface between the gate electrode and the gate insulating film can be reduced. As a result, it is possible to appropriately suppress variation in threshold voltage which is caused by the penetration of dopant, without lowering the impurity concentration in the gate electrode.

Further, when impurities such as oxygen, carbon and fluorine are mixed into the gate, by performing a heat treatment, these impurities are coupled to the hydrogen atoms or the deuterium atoms introduced into the gate, volatilizing, and thus the impurities can be removed from the gate. As a result, it is possible to suppress an increase in resistance of the gate electrode.

The method of the second aspect of the present invention can produce an effect of freeing up a distorted bond of the semiconductor atoms in a region where a stress is concentrated. This method also produces an effect of removing an impurity mixed into the source/drain regions with the hydrogen atoms or the deuterium atoms. Further, this method produces an effect of suppressing generation of an intruding portion of the metal-semiconductor compound layer in the vicinity of a portion below the gate insulating film or in the vicinity of an interface between the isolation insulating film and the semiconductor substrate. Furthermore, this method produces an effect of removing a native oxide film formed on the source/drain region with the hydrogen ions or the deuterium ions.

In the method of the third aspect of the present invention, since the step of introducing the hydrogen ions or the deuterium ions into the semiconductor film and the step of introducing the hydrogen ions or the deuterium ions into the semiconductor substrate are performed in the same process, a manufacturing process can be simplified as compared with a case where these steps are performed in different processes.

In the method of the fourth aspect of the present invention, since the semiconductor layer in which the impurity is introduced is formed on the extension region, it is possible to suppress an increase in sheet resistance of the extension region with the semiconductor layer of low resistance even when the extension region is formed shallower in the semiconductor substrate in order to suppress the short-channel effect.

In the method of the fifth aspect of the present invention, as the first effect, a bond of semiconductor atoms in the semiconductor substrate by the heat treatment and the semiconductor atoms are diffused so as to relieve a stress. At that time, the hydrogen atoms or the deuterium atoms introduced into the semiconductor substrate are coupled to some of the semiconductor atoms, to terminate an unsaturated bond. As a result, the distorted bond of the semiconductor atoms is freed up in a region where the stress is concentrated (in the vicinity of the corner defined by the bottom surface and the side surface of the isolation insulating film, in the vicinity of the corner defined by the side surface of the isolation insulating film and the upper surface of the semiconductor substrate and in the vicinity of the end portion of the gate electrode).

As the second effect, even when impurities such as oxygen, carbon and fluorine are mixed into the source/drain regions, by performing a heat treatment, the hydrogen atoms or the deuterium atoms introduced into the semiconductor substrate are coupled to these impurities, volatilizing, and thus the above impurities can be removed from the semiconductor substrate.

As the third effect, a hydrogen diffusion layer or a deuterium diffusion layer is formed in the vicinity of a portion below the gate insulating film and in the vicinity of the interface between the isolation insulating film and the semiconductor substrate. Since the silicidation reaction is suppressed in these regions as compared with other regions, it is possible to suppress generation of the intruding portion of the metal-semiconductor compound layer.

As the fourth effect, even when the native oxide film is formed on the exposed source/drain regions, the native oxide film is reduced by the hydrogen ions or the deuterium ions introduced into the semiconductor substrate, becoming $H_2O$ to volatilize.

For this reason, the native oxide film formed on the source/drain regions can be effectively removed. Therefore, it is possible to reduce the resistance value of the metal-semiconductor compound layer to be formed later on the source/drain regions.

In the method of the sixth aspect of the present invention, a distorted bond of the semiconductor atoms is freed up in a region where a stress is concentrated, specifically, in the vicinity of the corner defined by the bottom surface and the side surface of the isolation insulating film.

In the method of the seventh aspect of the present invention, a distorted bond of the semiconductor atoms is freed up in a region where a stress is concentrated, specifically, in the vicinity of the corner defined by the side surface of the isolation insulating film and the main surface of the semiconductor substrate.

In the method of the eighth aspect of the present invention, a distorted bond of the semiconductor atoms is freed up in a region where a stress is concentrated, specifically, in the vicinity of the end portion of the gate electrode.

In the method of the ninth aspect of the present invention, it is possible to increase the amount of hydrogen or deuterium remaining in the semiconductor substrate, not volatilizing, in the heat treatment.

In the method of the tenth aspect of the present invention, since the semiconductor layer in which the impurity is introduced is formed on the extension region, it is possible to suppress an increase in sheet resistance of the extension region with the semiconductor layer of low resistance even when the extension region is formed shallower in the semiconductor substrate in order to suppress the short-channel effect.

The method of the eleventh aspect of the present invention can produce an effect of freeing up a distorted bond of the semiconductor atoms in a region where a stress is concentrated. This method also produces an effect of removing an impurity mixed into the semiconductor layer with the hydrogen atoms or the deuterium atoms. Further, this method produces an effect of suppressing generation of an intruding portion of the metal-semiconductor compound layer in the vicinity of a portion below the gate insulating film and the like. Furthermore, this method produces an effect of removing a native oxide film formed on the semiconductor layer with the hydrogen ions or the deuterium ions.

In the method of the twelfth aspect of the present invention, by forming the source/drain regions, it is possible to further reduce the sheet resistance of the source and drain and achieve a still higher-speed operation.

In the semiconductor device of the thirteenth aspect of the present invention, the dopant introduced into the gate electrode is diffused multidirectionally along a lot of multidirectionally-extending grain boundaries in the granular grain layer in the process of manufacturing a semiconductor device. Therefore, the amount of dopant reaching the interface between the gate electrode and the gate insulating film can be reduced. As a result, it is possible to achieve a semiconductor device in which variation in threshold voltage which is caused by the penetration of dopant is suppressed.

The fourteenth aspect of the present invention can produce an effect of freeing up a distorted bond of the semiconductor atoms in a region where a stress is concentrated in the process of manufacturing a semiconductor device. This aspect of the present invention also produces an effect of removing an impurity mixed into the source/drain regions with the hydrogen atoms or the deuterium atoms. Further, this aspect of the present invention produces an effect of suppressing generation of an intruding portion of the metal-semiconductor compound layer in the vicinity of a portion below the gate insulating film or in the vicinity of the interface between the isolation insulating film and the semiconductor substrate. Furthermore, this aspect of the present invention produces an effect of removing a native oxide film formed on the source/drain regions with the hydrogen ions or the deuterium ions. Therefore, it is possible to achieve a semiconductor device whose leakage current is reduced.

In the semiconductor device of the fifteenth aspect of the present invention, since the semiconductor layer in which the impurity is introduced is formed on the extension region, it is possible to suppress an increase in sheet resistance of the extension region with the semiconductor layer of low resistance even when the extension region is formed shallower in the semiconductor substrate in order to suppress the short-channel effect.

The sixteenth aspect of the present invention can produce an effect of freeing up a distorted bond of the semiconductor atoms in a region where a stress is concentrated in the process of manufacturing a semiconductor device. This aspect of the present invention also produces an effect of removing an impurity mixed into the source/drain regions with the hydrogen atoms or the deuterium atoms. Further, this aspect of the present invention produces an effect of suppressing generation of an intruding portion of the metal-semiconductor compound layer in the vicinity of a portion below the gate insulating film or in the vicinity of the interface between the isolation insulating film and the semiconductor substrate. Furthermore, this aspect of the present invention produces an effect of removing a native oxide film formed on the source/drain regions with the hydrogen ions or the deuterium ions. Therefore, it is possible to achieve a semiconductor device whose leakage current is reduced.

In the semiconductor device of the seventeenth aspect of the present invention, a distorted bond of the semiconductor atoms is freed up in a region where a stress is concentrated, specifically, in the vicinity of the corner defined by the bottom surface and the side surface of the isolation insulating film.

In the semiconductor device of the eighteenth aspect of the present invention, a distorted bond of the semiconductor atoms is freed up in a region where a stress is concentrated, specifically, in the vicinity of the corner defined by the side surface of the isolation insulating film and the main surface of the semiconductor substrate.

In the semiconductor device of the nineteenth aspect of the present invention, a distorted bond of the semiconductor atoms is freed up in a region where a stress is concentrated, specifically, in the vicinity of the end portion of the gate electrode.

In the semiconductor device of the twentieth aspect of the present invention, since the semiconductor layer in which the impurity is introduced is formed on the extension region, it is possible to suppress an increase in sheet resistance of the extension region with the semiconductor layer of low resistance even when the extension region is formed shallower in the semiconductor substrate in order to suppress the short-channel effect.

The twenty-first aspect of the present invention can produce an effect of freeing up a distorted bond of the semiconductor atoms in a region where a stress is concentrated. This aspect of the present invention also produces an effect of removing an impurity mixed into the semiconductor layer with the hydrogen atoms or the deuterium atoms. Further, this aspect of the present invention produces an effect of suppressing generation of an intruding portion of the metal-semiconductor compound layer in the vicinity of a portion below the gate insulating film and the like. Furthermore, this aspect of the present invention produces an effect of removing a native oxide film formed on the semiconductor layer with the hydrogen ions or the deuterium ions. Therefore, it is possible to achieve a semiconductor device whose leakage current is reduced.

In the semiconductor device of the twenty-second aspect of the present invention, by forming the source/drain regions, it is possible to further reduce the sheet resistance of the source and drain and achieve a still higher-speed operation.

A first object of the present invention is to provide a method of manufacturing a semiconductor device and a structure of the semiconductor device, which can appropriately suppress variation in threshold voltage which is caused by the penetration of dopant without lowering an impurity concentration in a gate electrode. A second object of the present invention is to provide a method of manufacturing a semiconductor device and a structure of the semiconductor device, which can reduce leakage currents at gate, source and drain by avoiding generation of the intruding portion of a metal silicide at an interface between an offset film of the gate electrode and a silicon substrate or an interface between an STI and the silicon substrate. A third object of the present invention is to provide a method of manufacturing a semiconductor device and a structure of the semiconductor device, which can improve the current driving capability of a MOSFET by suppressing an increase in sheet resistance of an extension region even when the extension region is formed shallower in the silicon substrate.

These and other objects, features, aspects and advantages of the present invention will become more apparent from the following detailed description of the present invention when taken in conjunction with the accompanying drawings.

DESCRIPTION OF THE PREFERRED EMBODIMENTS

The First Preferred Embodiment

Figure 1:
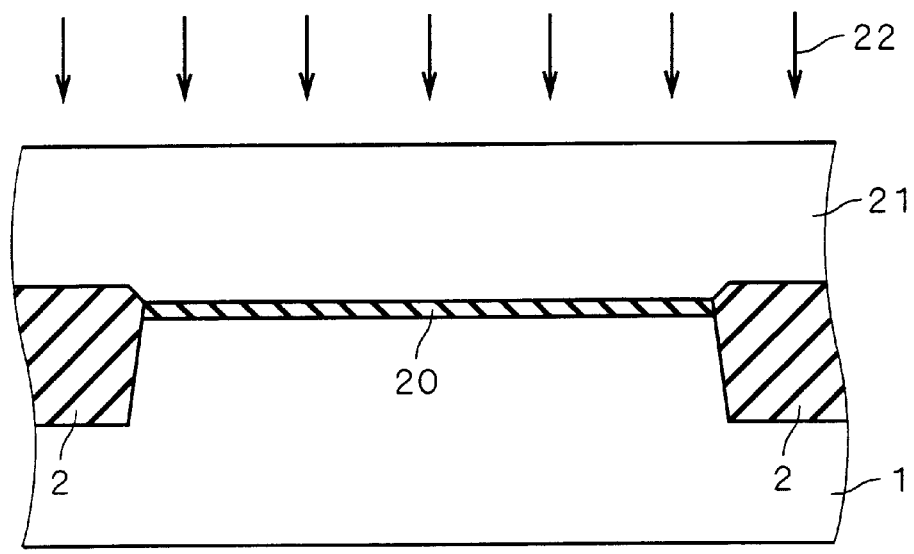
FIGS. 1 to 10 are cross sections showing a method of manufacturing a MOSFET in accordance with a first preferred embodiment of the present invention step by step.

FIGS. 1 to 10 are cross sections showing a method of manufacturing an N-type MOSFET in accordance with the first preferred embodiment of the present invention step by step. Referring to FIG. 1, first, an STI 2 is selectively formed in an upper surface of a silicon substrate 1 by well-known trench isolation technique. Subsequently, ion implantation is performed to form a well, a channel stopper layer and a channel dope layer (all not shown). Next, a silicon oxide film 20 is formed on the upper surface of the silicon substrate 1 by thermal oxidation method in an element formation region (active region) defined by the STI 2. Subsequently, an amorphous silicon film 21 is entirely deposited by the CVD method. Then, phosphorus ions 22 are implanted into the amorphous silicon film 21 by ion implantation in order to lower the resistance of a gate electrode.

Figure 2:
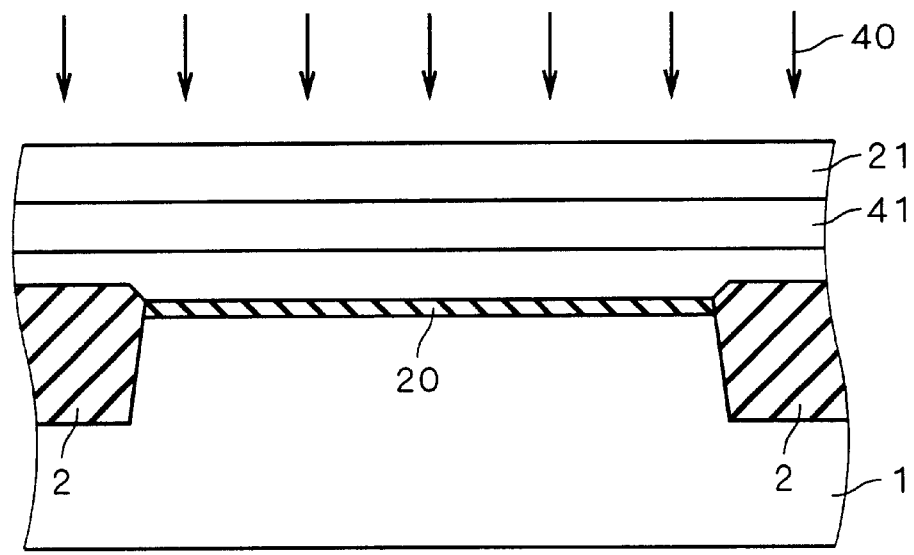

Referring to FIG. 2, in the next step, hydrogen ions 40 of high concentration are implanted into the amorphous silicon film 21 by ion implantation. The dose of hydrogen ions 40 is about $1 \times 10^{15}$ to $1 \times 10^{17}/cm^2$. With this ion implantation of the hydrogen ions 40, a hydrogen-ion implantation layer 41 is formed in the amorphous silicon film 21. Further, though FIG. 2 shows a case where the hydrogen-ion implantation layer 41 is formed only in a middle layer of the amorphous silicon film 21, the hydrogen-ion implantation layer 41 may be formed only in an upper layer or a lower layer. Furthermore, the hydrogen-ion implantation layer 41 may be formed, extending from the upper surface to the bottom surface of the amorphous silicon film 21. Instead of ion implantation, with radical beams of hydrogen atoms, hydrogen radical may be introduced into the amorphous silicon film 21. This also applies to the second and third preferred embodiments discussed later. The radical beams can be generated by well-known methods using an ECR plasma source or an RF plasma source, a hot filament system, or the like.

Figure 3:
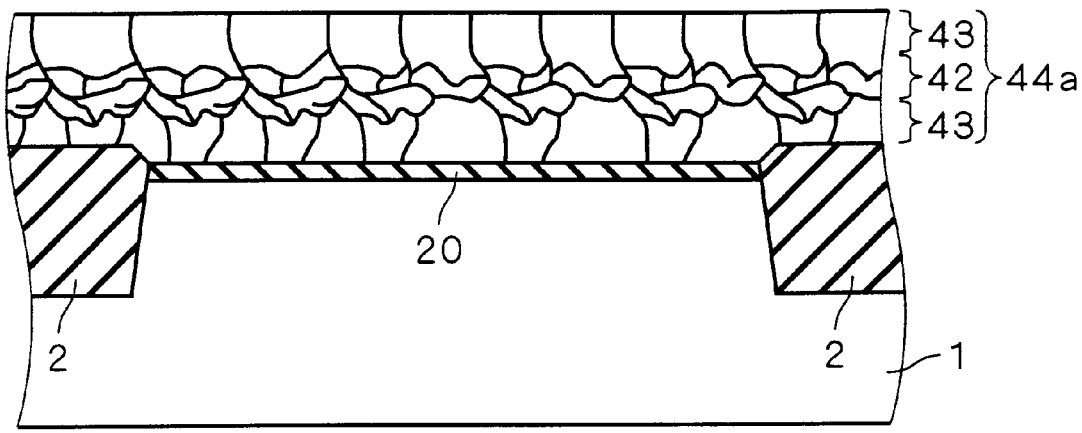

Referring to FIG. 3, in the next step, a heat treatment is performed at about 400 to 600° C. under the nitrogen atmosphere or the argon atmosphere. For example, the heat treatment is performed at about 550° C. where crystallization of the amorphous silicon starts. With this heat treatment, in a portion of the amorphous silicon film 21 other than a portion where the hydrogen-ion implantation layer 41 is formed, a columnar grain having a grain boundary extending along a direction of film thickness of the amorphous silicon film 21 is formed. On the other hand, in the hydrogen-ion implantation layer 41, since an unsaturated bond of the silicon atom is terminated by the hydrogen atom, the crystallization speed in the hydrogen-ion implantation layer 41 is lower than that in other portion of the amorphous silicon film 21. As a result, the size of grain formed by crystallization in the hydrogen-ion implantation layer 41 becomes smaller than that of the columnar grain formed by crystallization in the other portion, to form a granular grain. As shown in FIG. 3, a polysilicon film 44a formed by performing the heat treatment over the amorphous silicon film 21 has columnar grain layers 43 in the upper and lower layers and a granular grain layer 42 in the middle layer. Further, the granular grain layer 42 has a lot of grain boundaries extending multidirectionally, such as a grain boundary extending along a direction of film thickness of the polysilicon film 44a and a grain boundary extending along a direction other than that of film thickness of the polysilicon film 44a.

Figure 4:
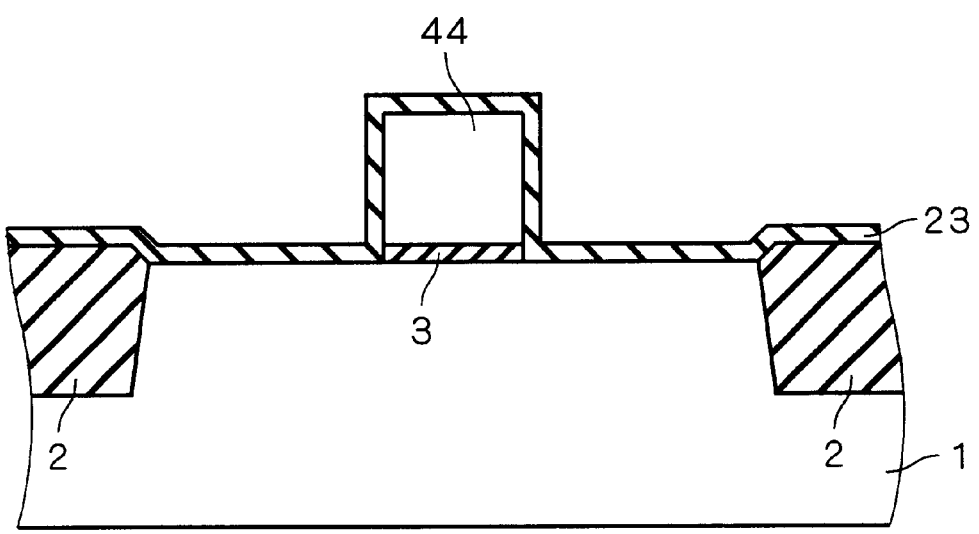

Referring to FIG. 4, in the next step, the polysilicon film 44a and the silicon oxide film 20 are patterned by photolithography and anisotropic dry etching, to form a gate electrode 44 and a gate insulating film 3. Subsequently, a silicon-oxide-based insulating film such as a TEOS film 23 is entirely deposited by the CVD method.

Figure 10:
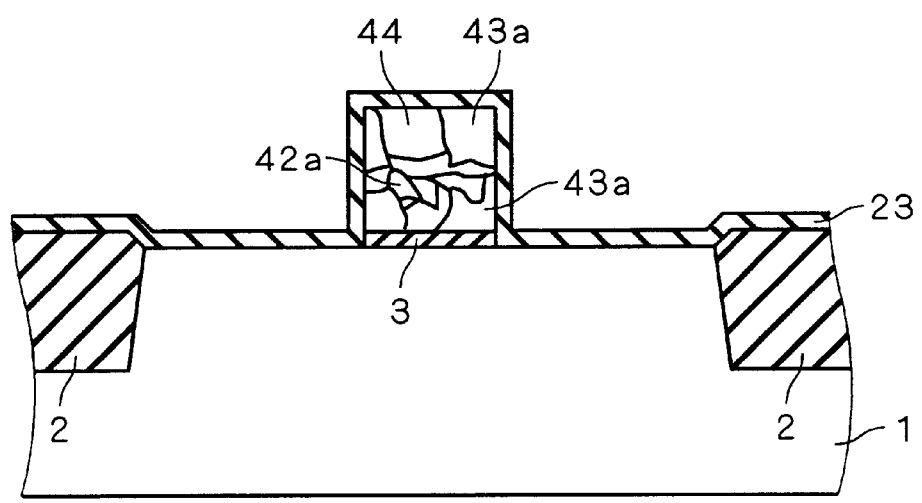

Instead of crystallization of the amorphous silicon by performing the heat treatment before the gate patterning (FIG. 3), there may be a case where crystallization of the amorphous silicon is carried out at the same time when the TEOS film 23 is deposited by setting the temperature for this deposition to about 400 to 600° C., as shown in FIG. 10.

Figure 5:
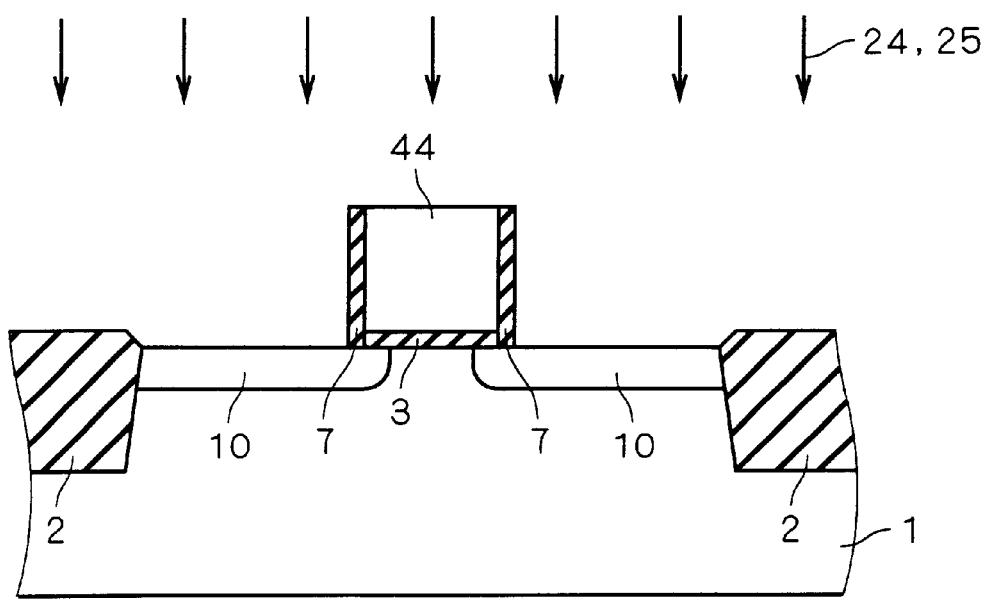

Referring to FIG. 5, in the next step, the TEOS film 23 is anisotropically etched, to form first offset films 7 on side surfaces of a gate structure consisting of the gate insulating film 3 and the gate electrode 44. Subsequently, arsenic ions 24 are implanted, to form an extension region 10 in the upper surface of the silicon substrate 1. Further, boron ions 25 are implanted, to form a pocket implantation region (not shown) in the silicon substrate 1.

Figure 6:
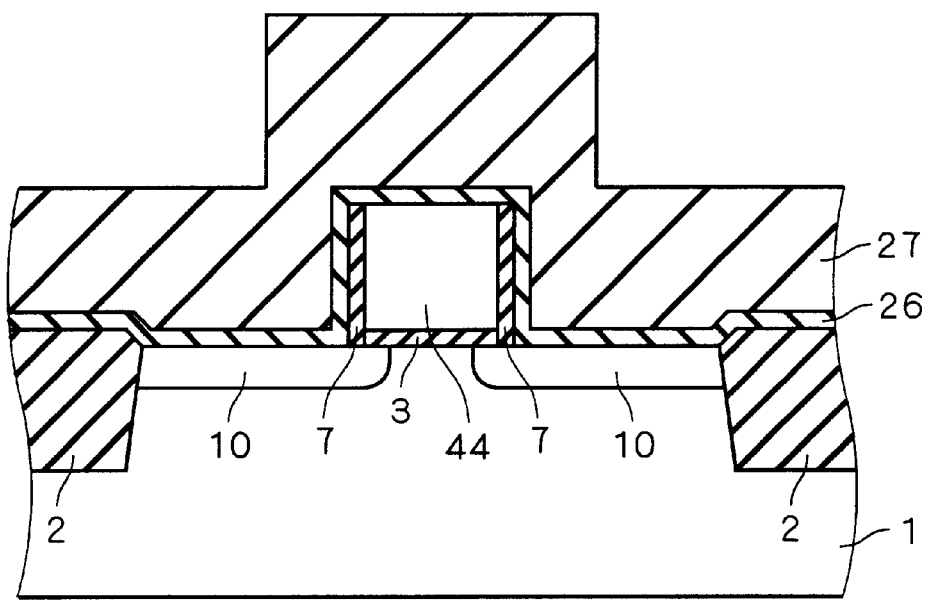
Figure 7:
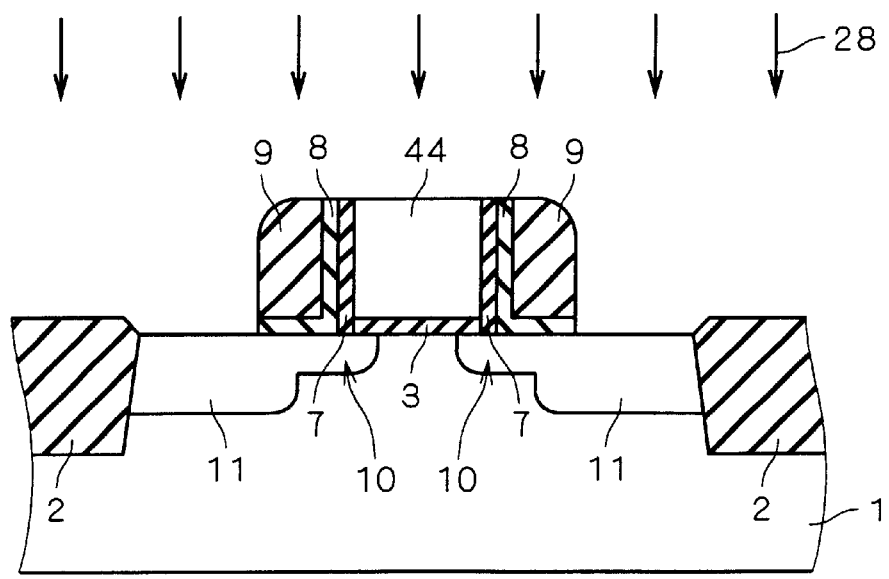

Referring to FIG. 6, in the next step, a TEOS film 26 and a silicon nitride film 27 are entirely deposited in this order by the CVD method. Referring to FIG. 7, in the next step, the silicon nitride film 27 and the TEOS film 26 are anisotropically etched, to form sidewalls 9 and second offset films 8. The second offset films 8 are formed on side surfaces of the first offset films 7 and the upper surface of the silicon substrate 1. The sidewalls 9 are formed on side surfaces of the gate electrode 44 with the first and second offset films 7 and 8 interposed therebetween. Subsequently, arsenic ions 28 are implanted, to form source/drain regions 11 in the upper surface of the silicon substrate 1. Subsequently, in order to electrically activate the arsenic ions 24 and 28 and the boron ions 25, an RTA is performed at 1100° C. With this heat treatment, the silicon substrate 1 is recovered from defects caused by the ion implantation.

Figure 8:
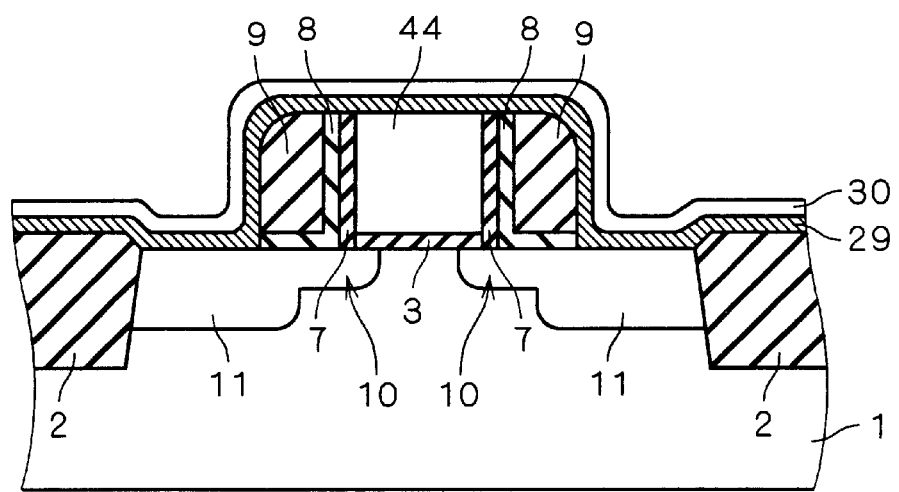

Referring to FIG. 8, in the next step, in order to amorphize upper surfaces of the source/drain regions 11, in other words, for the preamorphization, germanium ions (not shown) are implanted. Subsequently, by sputtering under the argon atmosphere, for example, a native oxide film (not shown) formed on surfaces of the source/drain regions 11 is removed. Next, a cobalt film 29 and a titanium nitride film 30 are entirely deposited in this order. A tungsten nitride film may be formed, instead of the titanium nitride film 30.

Figure 9:
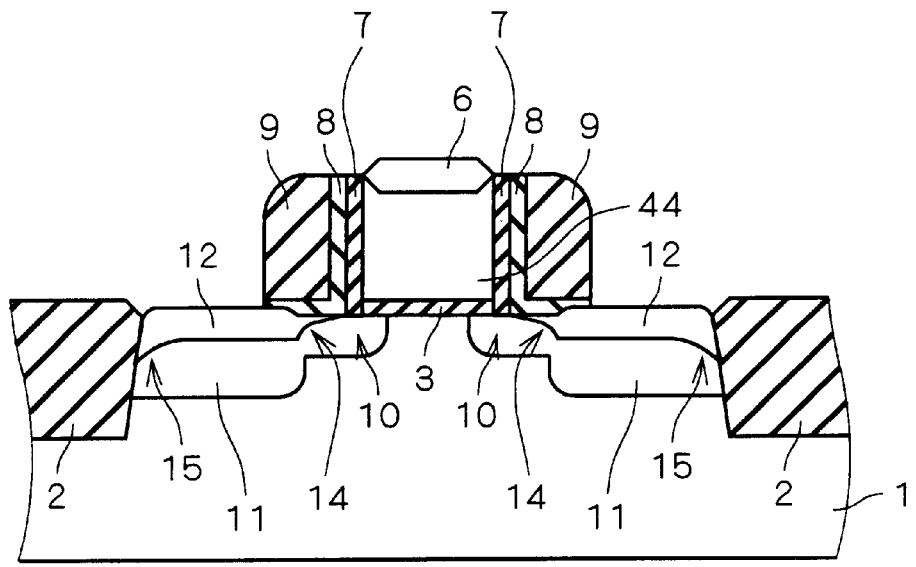

Referring to FIG. 9, in the next step, the first RTA is performed at 400° C. Subsequently, the titanium nitride film 30 and the unreacted cobalt film 29 are removed and then the second RTA is performed at 700° C. An upper surface of the gate electrode 44 is thereby silicified to form a cobalt silicide layer 6 and the upper surfaces of the source/drain regions 11 are silicified to form cobalt silicide layers 12.

Thus, in the method of manufacturing a MOSFET in accordance with the first preferred embodiment, by forming the hydrogen-ion implantation layer 41 through introducing the hydrogen ions 40 into the amorphous silicon film 21, the polysilicon film 44a at least partially having the granular grain layer 42 is formed through the heat treatment in the later step. As shown in FIG. 3, the granular grain layer 42 has a lot of grain boundaries extending multidirectionally, including the grain boundary not extending along the direction of film thickness of the polysilicon film 44a. Accordingly, the dopant introduced into the polysilicon film 44a and the gate electrode 44 is diffused multidirectionally along a lot of multidirectionally-extending grain boundaries in the granular grain layer 42. Therefore, the amount of dopant reaching an interface between the gate electrode 44 and the gate insulating film 3 can be reduced. As a result, it is possible to appropriately suppress variation in threshold voltage which is caused by the penetration of dopant, without lowering the impurity concentration in the gate electrode 44.

Further, when impurities such as oxygen, carbon and fluorine are mixed into the gate, these impurities are coupled to the silicon, forming an isolator, to thereby cause a problem of higher resistance of the gate electrode. In the method of manufacturing a MOSFET in accordance with the first preferred embodiment, however, since the heat treatment is performed at 200° C. or higher, the hydrogen atoms (or deuterium atoms discussed later) introduced into the gate are coupled to these impurities and then volatilize, to thereby remove the above impurities in the gate. As a result, it is possible to avoid an increase in resistance of the gate electrode.

Furthermore, though the above discussion has been made on the case where the hydrogen ions 40 are implanted into the amorphous silicon film 21 in the step of FIG. 2, deuterium ions ($D^+$) may be implanted, instead of the hydrogen ions ($H^+$). This also applies to the second and third preferred embodiments discussed later. When the temperature of the heat treatment for crystallization rises, the Si—H bond is broken and the hydrogen atoms in the polysilicon film 44a are changed into molecule ($H_2$), volatilizing out of the film. Then, the remaining silicon atoms are coupled to other silicon atoms to generate Si—Si bond, and the silicon thereby excessively polycrystallizes. Since the binding energy of the Si—D bond is higher than that of the Si—H bond, the amount of deuterium molecules ($D_2$) which volatilize through the heat treatment is smaller than that of hydrogen molecules in the heat treatment at the same temperature. As a result, excessive change into polysilicon (in other words, columnarization) can be also suppressed. Therefore, using the deuterium ions allows the heat treatment at higher temperature in forming the granular grain.

Though the above discussion has been made on the case where the heat treatment for crystallization is performed under the nitrogen atmosphere or the argon atmosphere, the heat treatment may be performed under the hydrogen atmosphere (or the deuterium atmosphere when the deuterium ions are implanted). This increases the amount of hydrogen or deuterium remaining in the polysilicon film 44a, thereby promoting formation of the granular grain.

The Second Preferred Embodiment

Figure 11:
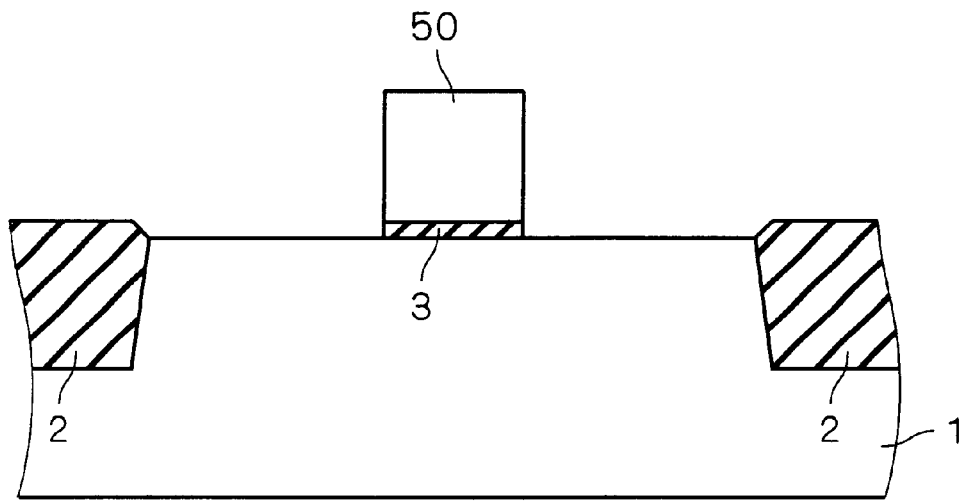
FIGS. 11 to 17 are cross sections showing a method of manufacturing a MOSFET in accordance with a second preferred embodiment of the present invention step by step.

FIGS. 11 to 17 are cross sections showing a method of manufacturing an N-type MOSFET in accordance with the second preferred embodiment of the present invention step by step. First, through the same process steps as in the first preferred embodiment, the structure shown in FIG. 1 is provided. Referring to FIG. 11, in the next step, the amorphous silicon film 21 and the silicon oxide film 20 are patterned by photolithography and anisotropic dry etching, to form a gate electrode 50 and the gate insulating film 3.

Figure 12:
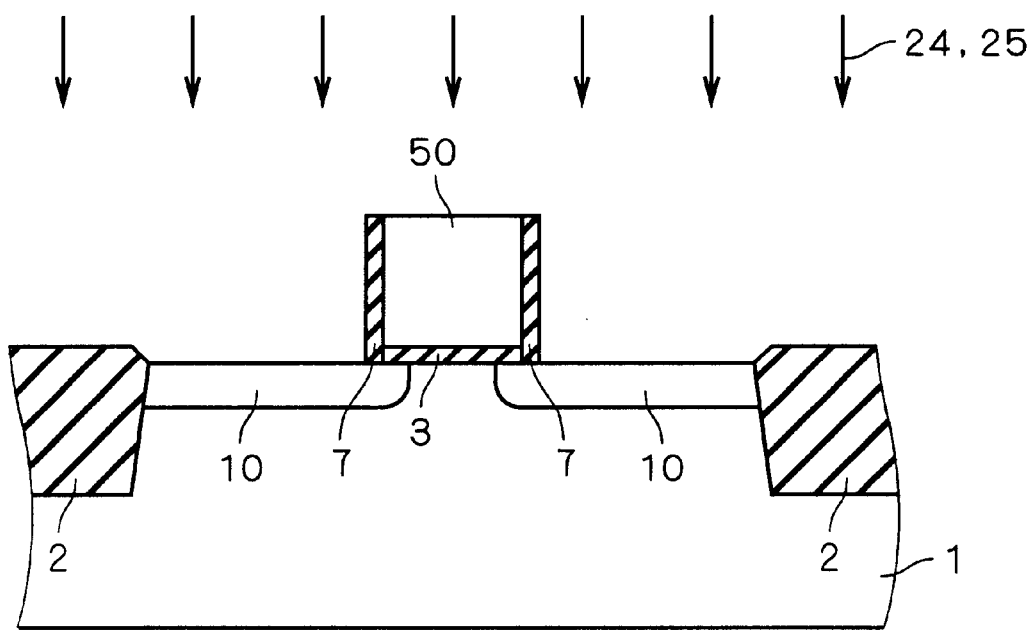

Referring to FIG. 12, in the next step, the TEOS film 23 is entirely deposited by the CVD method. Instead of the TEOS film 23, an HTO film, a silicon oxynitride film, a silicon nitride film or a multilayer film of these films may be formed. Next, the TEOS film 23 is anisotropically etched, to form the first offset films 7 on side surfaces of a gate structure consisting of the gate insulating film 3 and the gate electrode 50. Subsequently, the arsenic ions 24 are implanted, to form the extension region 10 in the upper surface of the silicon substrate 1. Further, the boron ions 25 are implanted, to form the pocket implantation region (not shown) in the silicon substrate 1.

Figure 13:
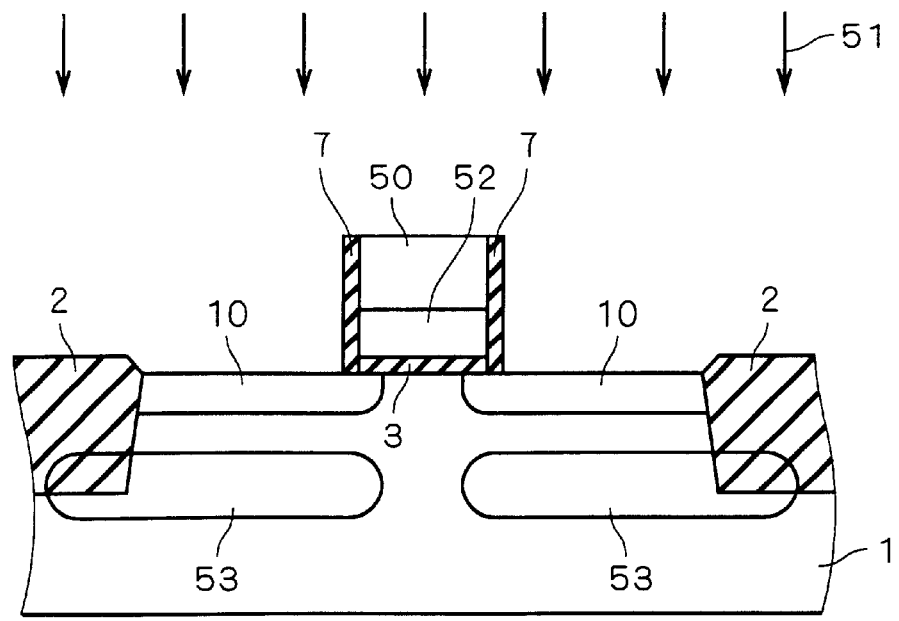

Referring to FIG. 13, in the next step, hydrogen ions 51 of high concentration are implanted into the silicon substrate 1 and the gate electrode 50 by ion implantation. The dose of the hydrogen ions is about $1 \times 10^{13}$ to $1 \times 10^{15}/cm^2$. With this ion implantation of the hydrogen ions 51, a hydrogen-ion implantation layer 52 is formed at a bottom portion of the gate electrode 50 and a hydrogen-ion implantation layer 53 is formed in the silicon substrate 1. In FIG. 13, the hydrogen-ion implantation layer 53 is formed at the depth including the vicinity of corner defined by a bottom surface and a side surface of the STI 2.

Figure 14:
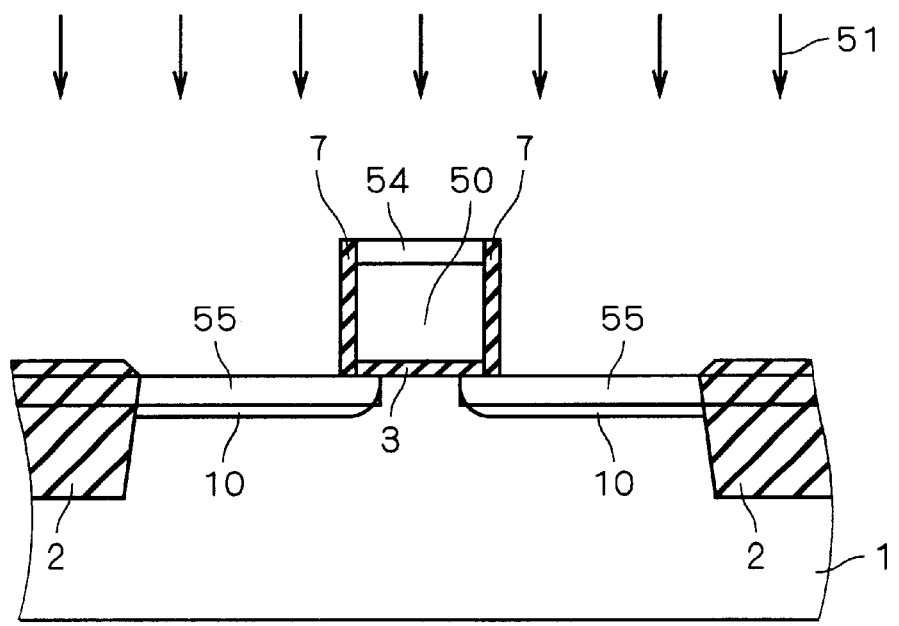

Further, referring to FIG. 14, additionally to the step of FIG. 13, or instead of the step of FIG. 13, another hydrogen-ion implantation layers 54 and 55 may be formed. The hydrogen-ion implantation layer 54 is formed in an upper surface of the gate electrode 50. The hydrogen-ion implantation layer 55 is formed in the upper surface of the silicon substrate 1 including the vicinity of a corner defined by the side surface of the STI 2 and the upper surface of the silicon substrate 1 and the vicinity of an end portion of the gate electrode 50.

Figure 15:
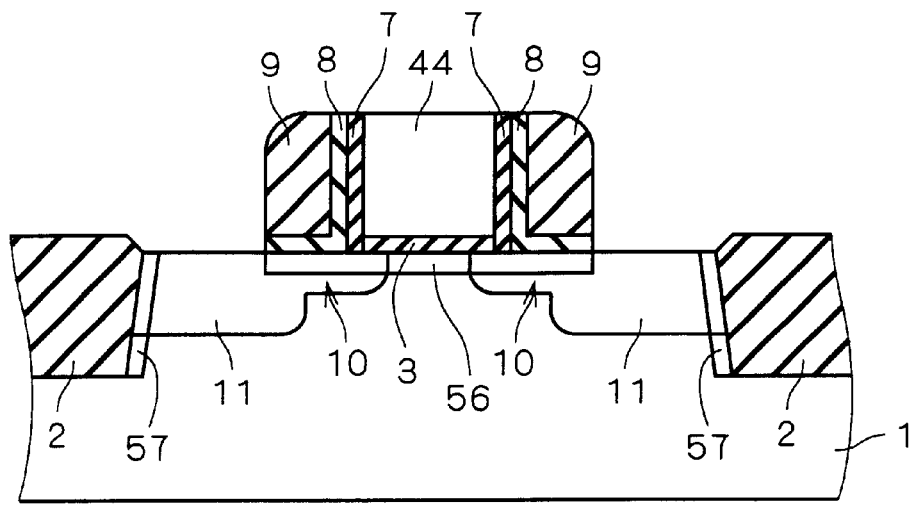

Referring to FIG. 15, in the next step, a TEOS film and a silicon nitride film are entirely deposited in this order by the CVD method, and then these films are anisotropically etched, to form the sidewalls 9 and the second offset films 108. The gate electrode 50 made of amorphous silicon is crystallized with the temperature for depositing the TEOS film and the silicon nitride film and changed into the gate electrode 44 having the granular grain layer. This produces the same effect as in the first preferred embodiment.

Further, the hydrogen ion 51 introduced into the silicon substrate I in the steps of FIGS. 13 and 14 is diffused in the silicon substrate 1 with the temperature for depositing the TEOS film and the silicon nitride film. Then, some of hydrogen atoms are coupled to each other to be changed into hydrogen molecule, volatilizing, and other hydrogen atoms remain in the vicinity of the interface between the STI 2 and the silicon substrate 1. A hydrogen diffusion layer 57 is thereby formed. Further, another hydrogen atoms remain in the vicinity of an interface between the second offset film 8 and the silicon substrate 1 and in the vicinity of an interface between the gate insulating film 3 and the silicon substrate 1. A hydrogen diffusion layer 56 is thereby formed.

Figure 16:
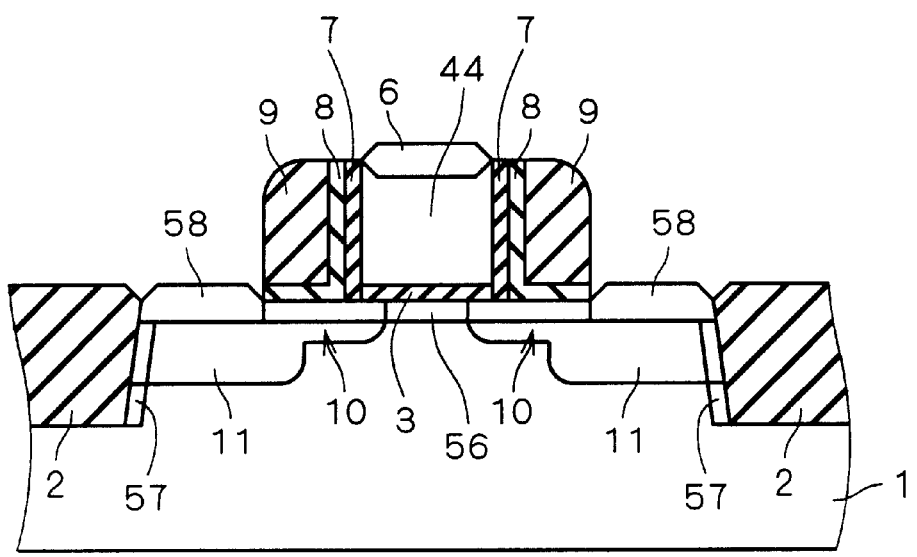

Referring to FIG. 16, in the next step, arsenic ions are implanted, to form the source/drain regions 11 in the upper surface of the silicon substrate 1. Subsequently, in order to activate the introduced dopant, an RTA is performed. Next, in order to cause preamorphization, germanium ions are implanted. Subsequently, a native oxide film formed on the surfaces of the source/drain regions 11 is removed. Next, a cobalt film and a titanium nitride film are entirely deposited in this order. The first RTA is performed at 450° C., and then the titanium nitride film and the unreacted cobalt film are removed. After that, the second RTA is performed at 700° C. The upper surface of the gate electrode 44 is thereby silicified to form the cobalt silicide layer 6 and the upper surfaces of the source/drain regions 11 are also thereby silicified to form a cobalt silicide layer 58.

Figure 17:
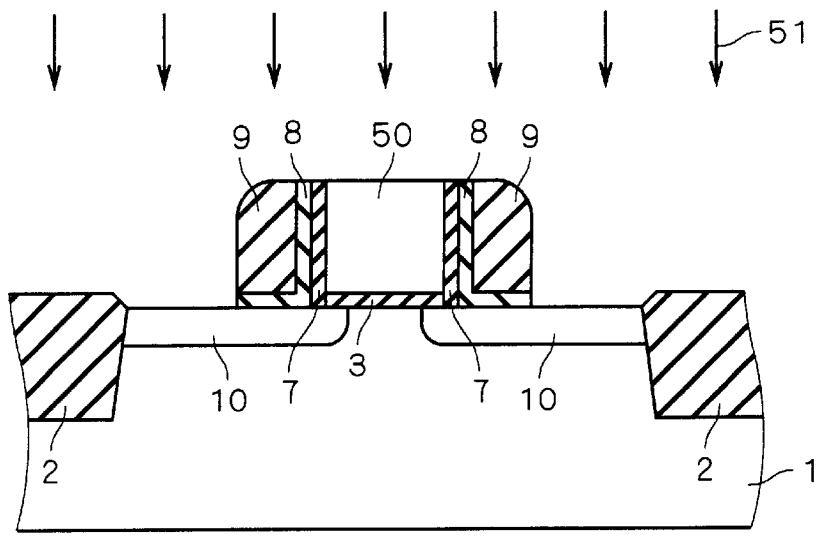

Further, though the above discussion has been made on the case where the hydrogen ions 51 are implanted before the step of forming the second offset film 8 and the sidewalls 9 (FIG. 15), the hydrogen ions 51 may be implanted after the second offset film 8 and the sidewalls 9 are formed as shown in FIG. 17 and then the heat treatment is performed at 200 to 600° C.

Thus, in the method of manufacturing a MOSFET in accordance with the second preferred embodiment, the following effect can be produced as well as the effect of the first preferred embodiment. The first effect is as follows. The Si—Si bond of silicon atoms in the silicon substrate 1 are broken by the heat treatment and the silicon atoms are thermally diffused so as to relieve a stress. Further, at that time, the hydrogen atoms in the hydrogen diffusion layers 56 and 57 are coupled to some of the silicon atoms to form a Si—H bond, terminating the unsaturated bond. As a result, a distorted bond of the silicon atoms is freed up in a region where the stress is concentrated (in the vicinity of the corner defined by the bottom surface and the side surface of the STI 2, in the vicinity of the corner defined by the side surface of the STI 2 and the upper surface of the silicon substrate 1 and in the vicinity of the end portion of the gate electrode 50).

The second effect is as follows. When impurities such as oxygen, carbon and fluorine are mixed into the source/drain regions 11, these impurities are coupled to the silicon, forming an insulator, to thereby cause a problem of higher resistance of the source/drain regions and an increase in leakage current. In the method of manufacturing MOSFET in accordance with the second preferred embodiment, however, since the heat treatment is performed at 200° C. or higher, the hydrogen atoms introduced into the silicon substrate 1 are coupled to these impurities, volatilizing, and thus the above impurities can be removed from the silicon substrate 1.

With the second effect, the cobalt silicide layer 58 having excellent crystallinity can be formed and consequently, even when the cobalt silicide layer 58 is formed in a narrow region of about 0.15 μm or less, a break of wire can be prevented.

The third effect is as follows. The hydrogen diffusion layer 56 is formed below the first and second offset films 7 and 8 and the gate insulating film 3, and the hydrogen diffusion layer 57 is formed in the vicinity of the interface between the STI 2 and the silicon substrate 1. Since the silicon atoms and the hydrogen atoms are coupled to each other to form Si—H bond in the hydrogen diffusion layers 56 and 57, the silicidation reaction is suppressed in these regions as compared with other regions. Therefore, it is possible to suppress generation of the intruding portions 114 and 115 of the cobalt silicide layer 112 which is the problem in the background-art technique.

The fourth effect is as follows. Even when the native oxide film is formed on the exposed source/drain regions 11, the native oxide film is reduced by the hydrogen ions 51 introduced into the silicon substrate 1, becoming $H_2O$ to volatilize. For this reason, the native oxide film formed on the source/drain regions 11 can be effectively removed. Therefore, it is possible to lower the resistance value of the cobalt silicide layer 58 to be formed later on the source/drain regions 11.

Further, since the RTA for forming the cobalt silicide layer 58 and other heat treatments are performed under the hydrogen atmosphere (or the deuterium atmosphere when the deuterium ions are implanted), the amount of hydrogen or deuterium remaining in the silicon substrate 1 can be increased, to enhance the above effects.

Figure 18:
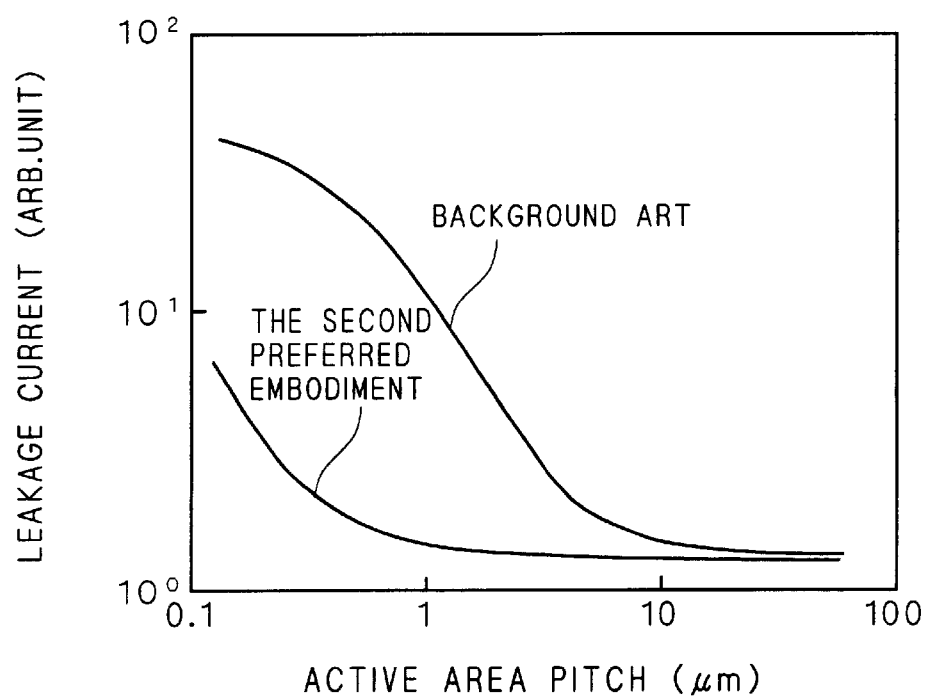
FIG. 18 is a graph showing a relation between the pitch of an active region and a pn junction leakage current.

FIG. 18 is a graph showing a relation between the pitch of an active region and a pn junction leakage current. As the pitch of the active region becomes narrower with miniaturization of the semiconductor devices, the stresses in the vicinity of the corner defined by the bottom surface and the side surface of the STI 2 and in the vicinity of the corner defined by the side surface of the STI 2 and the upper surface of the silicon substrate 1 increase and therefore the pn junction leakage current also increases. It can be seen from FIG. 18, however, that in the method of manufacturing a MOSFET in accordance with the second preferred embodiment, an increase in pn junction leakage current is suppressed as compared with the background-art case mainly by the first and second effects.

Figure 19:
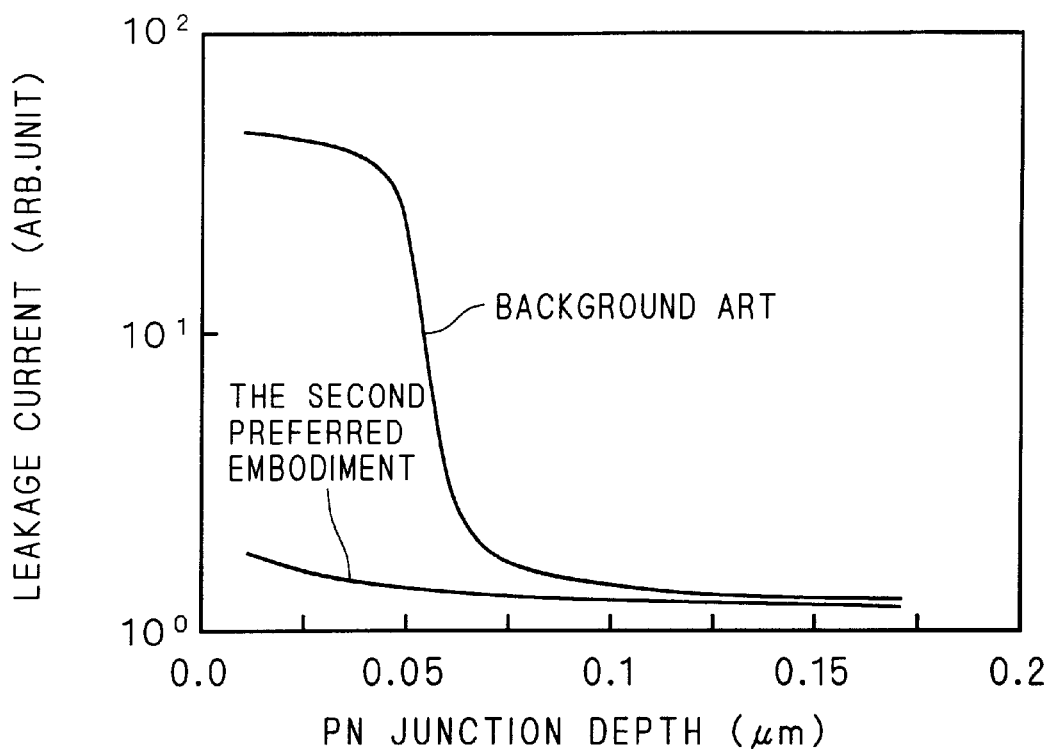
FIG. 19 is a graph showing a relation between the depth of a pn junction and the magnitude of leakage currents.
Figure 35:
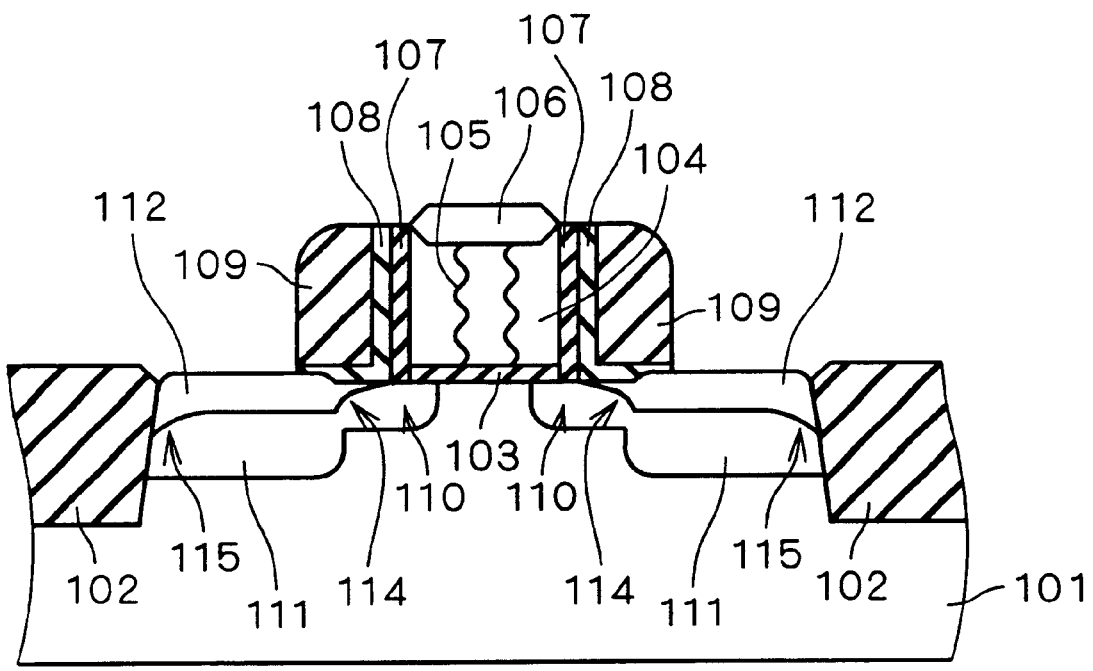

FIG. 19 is a graph showing a relation between the depth of the source/drain region 11 (a pn junction) from the upper surface of the silicon substrate 1 and the magnitude of leakage currents. In the background art, when the depth of the pn junction becomes narrower than 0.05 µm, the leakage current sharply increases since the intruding portion 115 of the cobalt silicide layer 112 shown in FIG. 35 reaches the depletion layer of the pn junction. It can be seen from FIG. 19, however that in the method of manufacturing a MOSFET in accordance with the second preferred embodiment, the leakage current is reduced in a region where the depth of the pn junction is 0.05 µm or less by the first and third effects.

Further, since whether the first and second offset films 7 and 8 are provided or not does not make difference on the effects of the second preferred embodiment, these films may be or may not be provided for achieving the effects of the second preferred embodiment of the present invention.

The Third Preferred Embodiment

Figure 20:
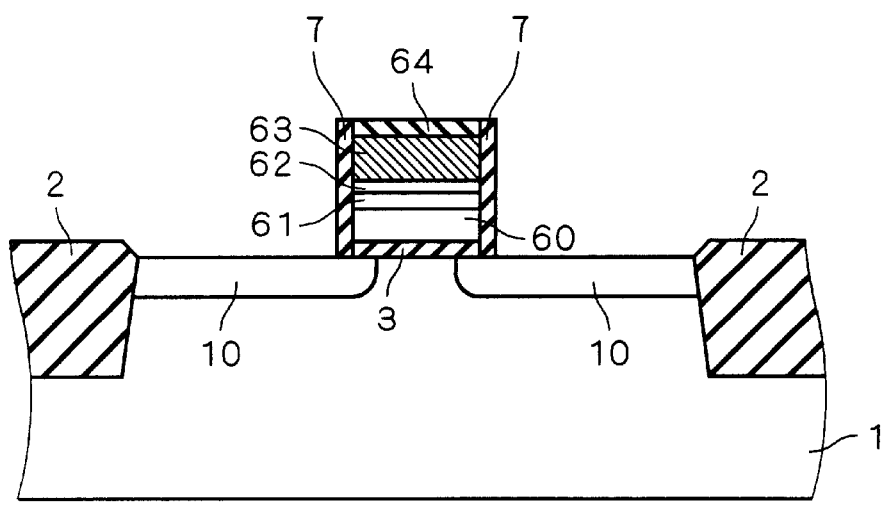
FIGS. 20 to 24 are cross sections showing a method of manufacturing a MOSFET in accordance with a third preferred embodiment of the present invention step by step.

FIGS. 20 to 24 are cross sections showing a method of manufacturing an N-type MOSFET in accordance with a third preferred embodiment of the present invention step by step. Referring to FIG. 20, first, the STI 2 is selectively formed in the upper surface of the silicon substrate 1 by well-known trench isolation technique. Subsequently, ion implantation is performed to form a well, a channel stopper layer and a channel dope layer (all not shown). Next, a gate structure is selectively formed on the upper surface of the silicon substrate 1 by a well-known method in the element formation region defined by the STI 2. The gate structure has a polymetal gate structure in which the gate insulating film 3, a doped polysilicon layer 60, a tungsten silicide layer 61, a tungsten nitride layer 62, a tungsten layer 63 and an insulating film 64 are layered in this order.

Subsequently, the first offset films 7 are formed on side surfaces of the gate structure. The first offset film 7 is made of a TEOS or an HTO (an oxide film deposited at high temperature). Next, arsenic ions are implanted at an implantation energy of about 0.1 to 3 keV with the above gate structure used as an implantation mask, to form the extension region 10 being self-aligned in the upper surface of the silicon substrate 1.

In order to activate the arsenic ion, an RTA is performed. With this heat treatment, the silicon substrate 1 is recovered from defects caused by the ion implantation and the upper surface of the silicon substrate 1 is recrystallized.

Though discussion is made on the case of manufacturing an N-type MOSFET, when a P-type MOSFET is formed, by implanting indium ions, boron ions or $BF_2$ ions, instead of the arsenic ions, the extension region is formed. Further, when the N-type MOSFET and the P-type MOSFET are formed on one silicon substrate 1, regions for forming the respective types of MOSFETs are alternately covered with a photoresist, to form extension regions of different conductivity types in the respective regions. In this case, an RTA for recrystallization of the silicon substrate 1 is performed after the ion implantations are completed in both regions.

Figure 21:
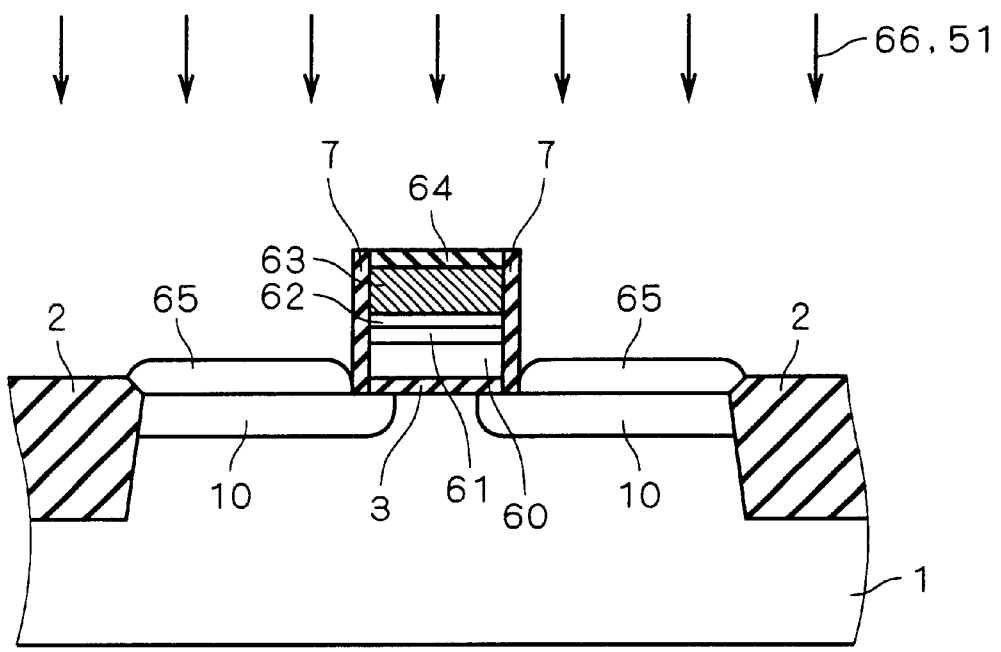

Referring to FIG. 21, in the next step, an epitaxial growth layer 65 is formed on the extension region 10 by the selective epitaxial growth method using the exposed silicon as seed crystal. A [111] faceted surface is likely to appear on the periphery of an end portion of the gate structure and the [111] faceted surface epitaxially grows slower than a [100] faceted surface. For this reason, the film thickness of the epitaxial growth layer 65 on the periphery of the end portion of the gate structure is thinner than that in other portion.

Next, arsenic ions 66 for lowering resistance are implanted into the epitaxial growth layer 65 by ion implantation. When the P-type MOSFET is formed, however, indium ions, boron ions or $BF_2$ ions are implanted, instead of the arsenic ions. The impurity concentration of the epitaxial growth layer 65 is set higher than that of the extension region 10.

Subsequently, the hydrogen ions 51 are implanted into the epitaxial growth layer 65 by ion implantation. This produces the same effects as in the second preferred embodiment. In the third preferred embodiment, however, the implantation of the hydrogen ions 51 does not necessarily have to be performed and may be omitted. Further, if the implantation of the hydrogen ions 51 is performed, by providing the gate electrode having the same structure as that of the second preferred embodiment, it is also possible to produce the effect of suppressing variation in threshold voltage which is caused by the penetration of dopant. Furthermore, after the hydrogen ions 51 are implanted, the heat treatment may be performed under the hydrogen atmosphere, for example. With this heat treatment, since the silicon atoms in the epitaxial growth layer 65 are diffused and the film thickness of the epitaxial growth layer 65 at the periphery of the end portion of the gate structure becomes slightly thicker, it is possible to make the film thickness of the epitaxial growth layer 65 uniform to some degree.

Figure 22:
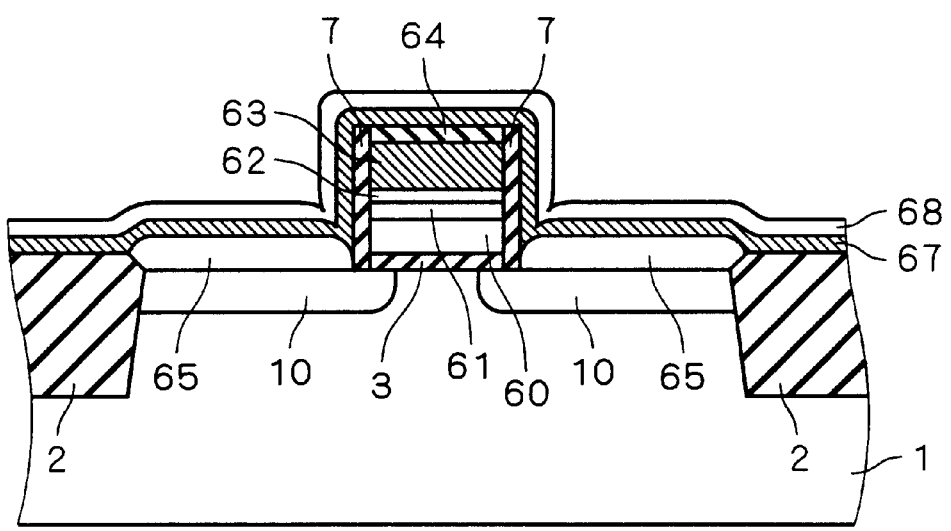

Referring to FIG. 22, in the next step, in order to cause preamorphization over the epitaxial growth layer 65, germanium ions are implanted. Subsequently, a native oxide film formed on a surface of the epitaxial growth layer 65 is removed. Next, a cobalt film 67 and a tungsten nitride film 68 are entirely deposited in this order.

Figure 23:
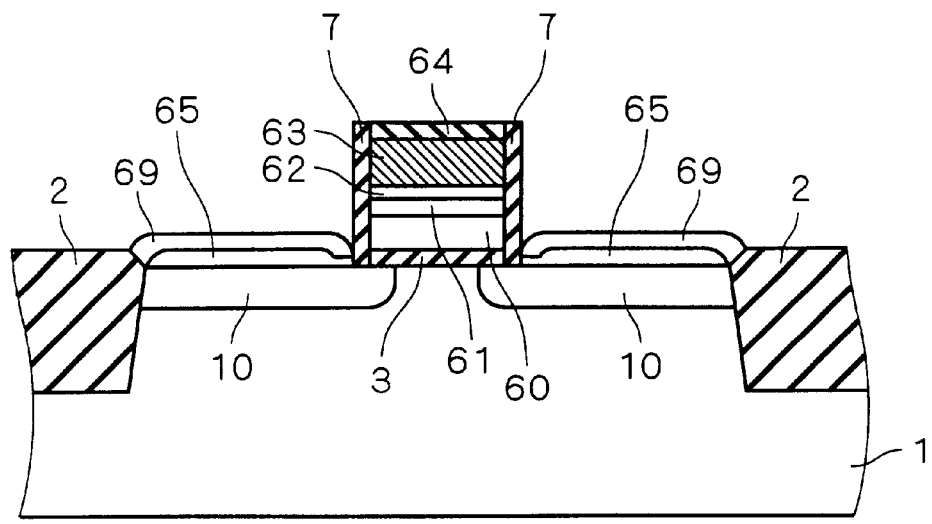

Referring to FIG. 23, in the next step, the first RTA is performed at 400° C., and then the tungsten nitride film 68 and the unreacted cobalt film 67 are removed. After that, the second RTA is performed at 550 to 700° C. An upper surface of the epitaxial growth layer 65 is thereby silicified to form a cobalt silicide layer 69. Further, with this heat treatment, the epitaxial growth layer 65 is recovered from defects caused by the ion implantation and the introduced dopant is activated.

Figure 24:
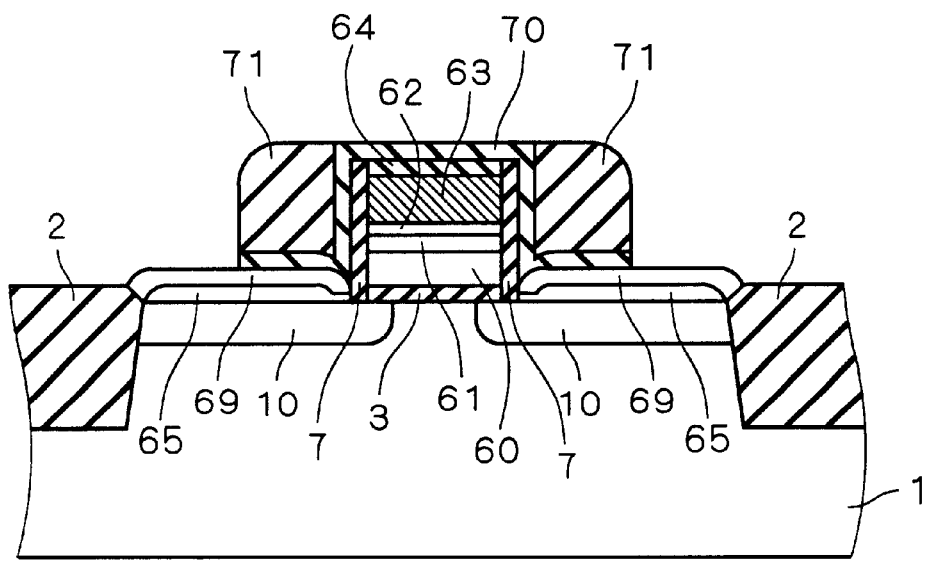

Referring to FIG. 24, in the next step, a TEOS film (or an HTO film) is entirely deposited to have a film thickness of about 10 nm, and then a silicon nitride film is entirely deposited to have a film thickness of about 40 to 60 nm. Subsequently, the silicon nitride film and the TEOS film are anisotropically etched, to form second offset films 70 and sidewalls 71. The relative permittivity of the silicon nitride film is about 7 to 9 while that of the TEOS film and the HTO film is about 3.9 to 4.1. Thus, since the second offset film 70 is made of a material having relative permittivity smaller than that of the material of the sidewall 71, the parasitic capacitance consisting of the gate and the source and drain is reduced and the operating speed of a circuit becomes faster.

The above discussion has been made on the case where the extension region 10 is formed in the upper surface of the silicon substrate 1 (FIG. 20) and then the epitaxial growth layer 65 in which the impurity is introduced is formed on the extension region 10 (FIG. 21). There may be a case, however, where the epitaxial growth layer 65 with no dopant is formed on the upper surface of the silicon substrate 1 without forming the extension region 10 in the step of FIG. 20. In this case, by controlling the implantation energy and the dose of arsenic ions 66, the extension region 10 is formed in the upper surface of the silicon substrate 1 and an impurity diffusion layer of high concentration is formed in the epitaxial growth layer 65.

Thus, in the method of manufacturing a MOSFET in accordance with the third preferred embodiment, the epitaxial growth layer 65 in which the impurity is densely introduced is formed on the upper surface of a portion of the silicon substrate 1 where the extension region 10 is formed. Therefore, even when the extension region 10 is formed shallower in the silicon substrate 1 in order to suppress the short-channel effect, the epitaxial growth layer 65 of low resistance can suppress an increase in sheet resistance of the extension region 10. As a result, it is possible to improve the current driving capability of the MOSFET.

Further, since the cobalt silicide layer 69 is formed on the epitaxial growth layer 65, the cobalt silicide layer 69 can be formed farther away from the upper surface of the silicon substrate 1 by the film thickness of the epitaxial growth layer 65. As a result, even when a spike-like metal silicide is formed due to abnormal growth, the leakage current caused by the spike-like metal silicide can be suppressed as compared with the background-art MOSFET.

Figure 25:
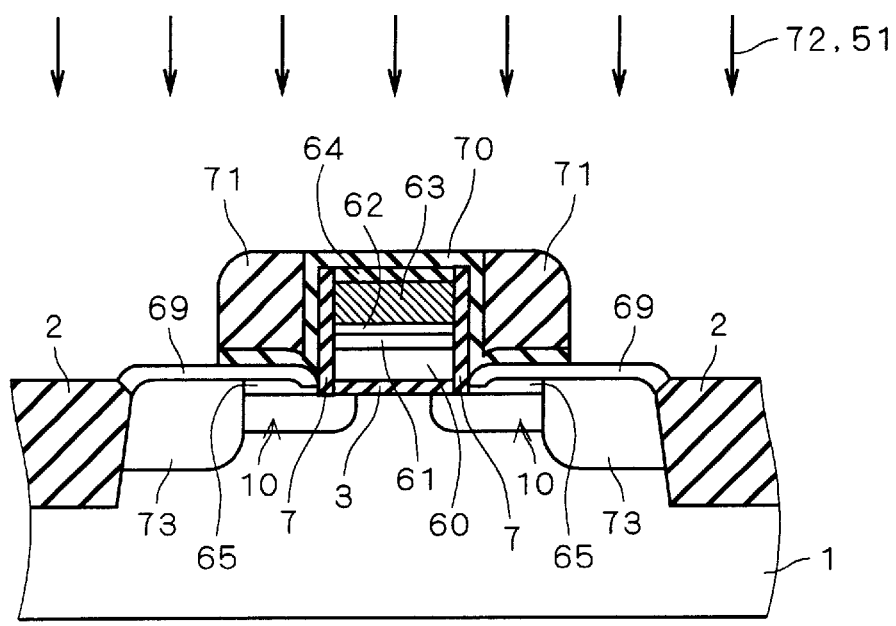
FIG. 25 is a cross section showing a step in a method of manufacturing a MOSFET in accordance with a first variation of the third preferred embodiment of the present invention.

FIG. 25 is a cross section showing a step in a method of manufacturing a MOSFET in accordance with the first variation of the third preferred embodiment of the present invention. After providing the structure of FIG. 24, arsenic ions 72 are implanted. The introduced arsenic ions 72 are activated by the later heat treatment, to form source/drain regions 73 being self-aligned. The impurity concentration of the source/drain region 73 is set higher than that of the epitaxial growth layer 65. Further, by implanting the hydrogen ions 51, the same effect as in the second preferred embodiment can be produced. For example, since an impurity mixed into the cobalt silicide layer 69 is coupled to the hydrogen atoms to volatilize, the break of the cobalt silicide layer 69 can be prevented.

Figure 26:
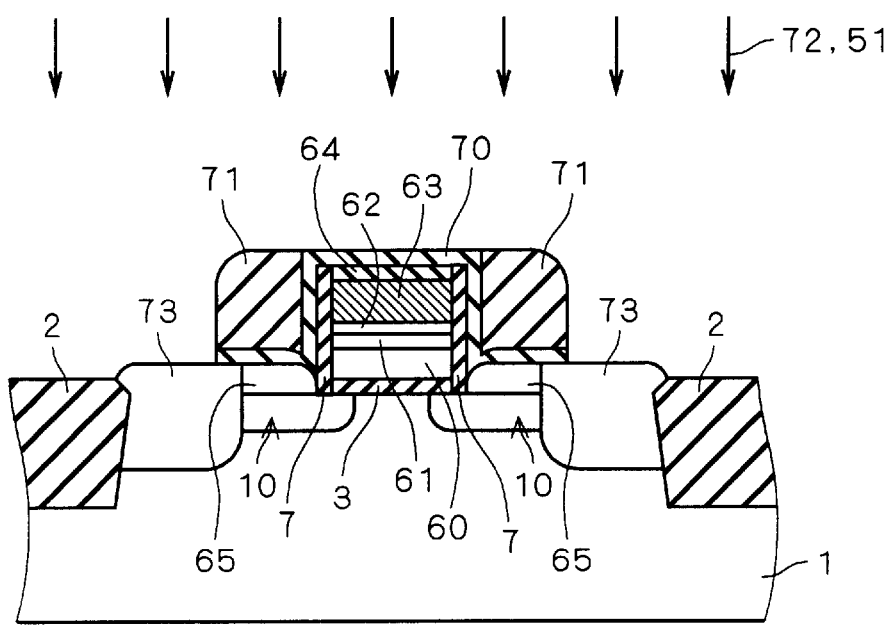
FIGS. 26 and 27 are cross sections showing a method of manufacturing a MOSFET in accordance with a second variation of the third preferred embodiment of the present invention step by step.
Figure 27:
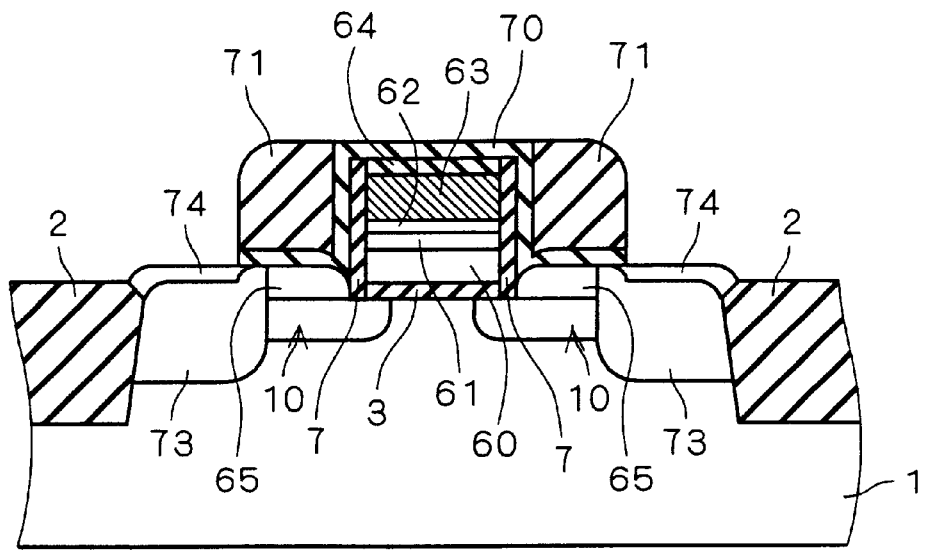
Figure 28:
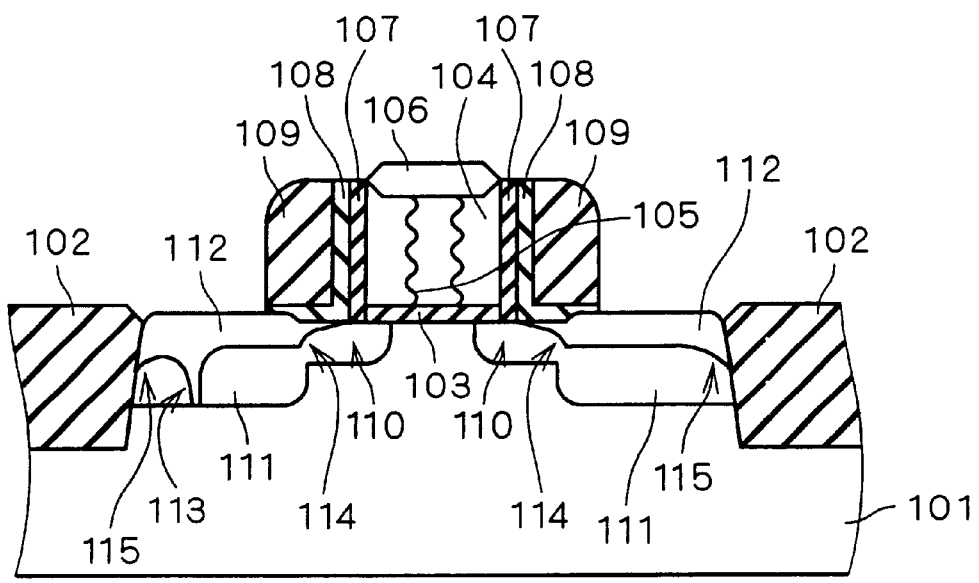
FIG. 28 is a cross section showing a structure of a general-type MOSFET in which a cobalt silicide is formed.
Figure 29:
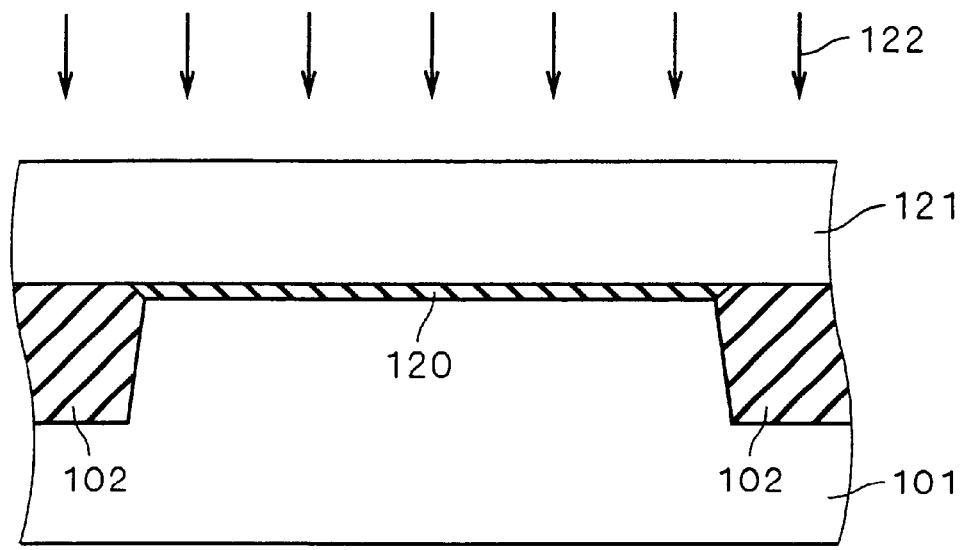
FIGS. 29 to 35 are cross sections showing a method of manufacturing a MOSFET in the background art step by step.
Figure 30:
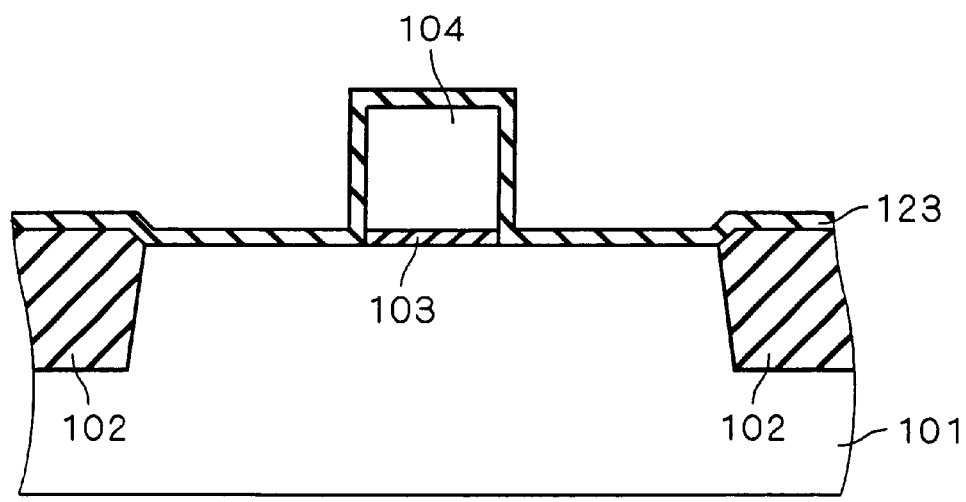
Figure 31:
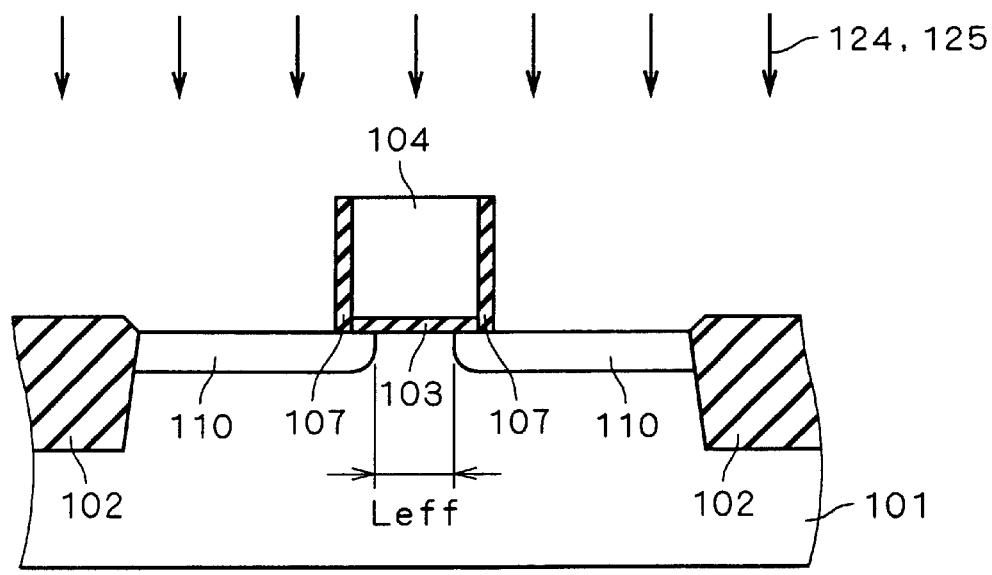
Figure 32:
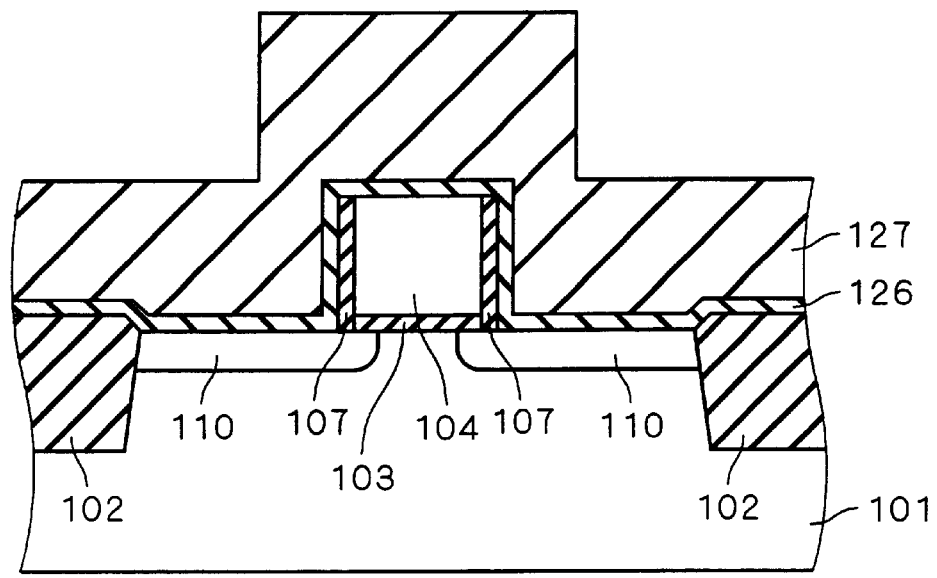
Figure 33:
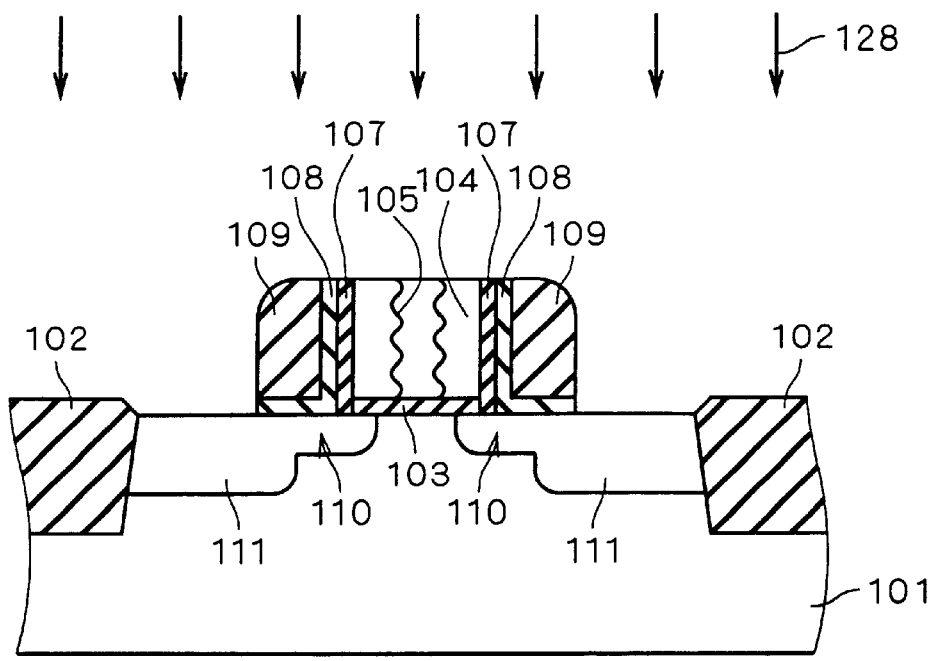
Figure 34:
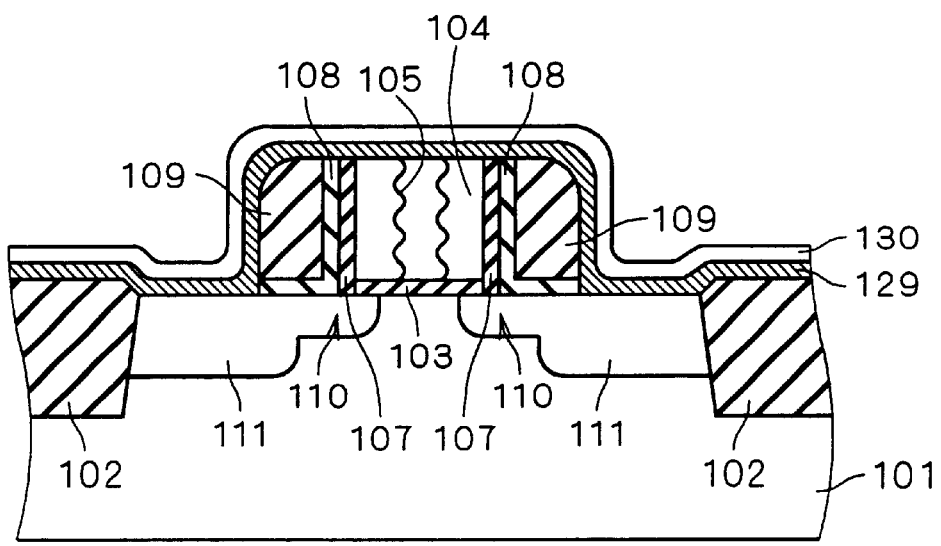

FIGS. 26 and 27 are cross sections showing a method of manufacturing a MOSFET in accordance with the second variation of the third preferred embodiment of the present invention step by step. Referring to FIG. 26, first, after providing the structure of FIG. 21, the second offset films 70 and the sidewalls 71 are formed. Next, the arsenic ions 72 are implanted and then a heat treatment is performed, to form the source/drain regions 73 being self-aligned. At that time, the hydrogen ions 51 may be implanted. Referring to FIG. 27, in the next step, a cobalt film and an antioxidizing film (such as a tungsten nitride film or a titanium nitride film) are deposited and then an RTA is performed, to form a cobalt silicide layer 74 being self-aligned on the upper surface of a portion of the epitaxial growth layer 65 which is exposed from the sidewalls 71.

In the method of manufacturing a MOSFET in accordance with the first and second variations of the third preferred embodiment, by forming the source/drain region 73 having impurity concentration higher than that of the epitaxial growth layer 65, it is possible to further lower the sheet resistance of the source and drain and achieve a still higher-speed operation.

Though discussion in the first to third preferred embodiments has been made on the case of using a normal silicon substrate, the present invention using a well-known SOI (Silicon On Insulator) substrate or SON (Silicon On Nothing) substrate can also produce the same effects.

Further, though discussion in the first to third preferred embodiments has been made on the case of using the gate electrode of metal silicide gate structure or polymetal gate structure, the present invention using a well-known gate electrode of metal gate structure or other structure can also produce the same effects.

While the invention has been shown and described in detail, the foregoing description is in all aspects illustrative and not restrictive. It is therefore understood that numerous modifications and variations can be devised without departing from the scope of the invention.

What is claimed is:

1. A method of manufacturing a semiconductor device, comprising the steps of:
   (a) preparing a semiconductor substrate;
   (b) forming a semiconductor film of amorphous substance on a main surface of said semiconductor substrate with an insulating film interposed therebetween;
   (c) introducing an impurity for lowering resistance into said semiconductor film;
   (d) introducing hydrogen ions or deuterium ions into an interior of said semiconductor film;
   (e) performing a heat treatment to polycrystallize said amorphous substance after said step (d); and
   (f) patterning said semiconductor film to form a gate electrode on said main surface of said semiconductor substrate with a gate insulating film interposed therebetween.

2. The method of manufacturing a semiconductor device according to claim 1, wherein
   said heat treatment in said step (e) is performed under a hydrogen atmosphere or a deuterium atmosphere.

3. The method of manufacturing a semiconductor device according to claim 1, further comprising the steps of:
   (g) selectively forming an isolation insulating film in said main surface of said semiconductor substrate;

(h) introducing hydrogen ions or deuterium ions into said semiconductor substrate;

(i) forming source/drain regions which are paired with said gate electrode interposed therebetween in said main surface of said semiconductor substrate within an element formation region defined by said isolation insulating film; and (j) forming metal-semiconductor compound layers on said source/drain regions.

4. The method of manufacturing a semiconductor device according to claim 3, wherein said steps (d) and (h) are performed in the same process after said step (f).

5. The method of manufacturing a semiconductor device according to claim 1, further comprising the steps of:

(k) forming extension regions which are paired with said gate electrode interposed therebetween in said main surface of said semiconductor substrate; and (l) forming semiconductor layers in which an impurity for lowering resistance is introduced on said extension regions.

6. A method of manufacturing a semiconductor device, comprising the steps of:

(a) preparing a semiconductor substrate;

(b) selectively forming an isolation insulating film in a main surface of said semiconductor substrate;

(c) selectively forming a gate electrode on said main surface of said semiconductor substrate with a gate insulating film interposed therebetween within an element formation region defined by said isolation insulating film;

(d) introducing hydrogen ions or deuterium ions into an interior of said semiconductor substrate;

(e) forming source/drain regions which are paired with said gate electrode interposed therebetween in said main surface of said semiconductor substrate within said element formation region; and (f) forming metal-semiconductor compound layers on said source/drain regions.

7. The method of manufacturing a semiconductor device according to claim 6, wherein said hydrogen ions or said deuterium ions are introduced at least in the vicinity of a corner defined by a bottom surface and a side surface of said isolation insulating film in said step (d).

8. The method of manufacturing a semiconductor device according to claim 6, wherein said hydrogen ions or said deuterium ions are introduced at least in the vicinity of a corner defined by a side surface of said isolation insulating film and said main surface of said semiconductor substrate in said step (d).

9. The method of manufacturing a semiconductor device according to claim 6, wherein said hydrogen ions or said deuterium ions are introduced in said main surface of said semiconductor substrate at least in the vicinity of an end portion of said gate electrode in said step (d).

10. The method of manufacturing a semiconductor device according to claim 6, wherein said step (f) has the steps of
(f-1) forming metal films on said source/drain regions; and
(f-2) performing a heat treatment to react said metal films with said source/drain regions,
and wherein said heat treatment in said step (f-2) is performed under a hydrogen atmosphere or a deuterium atmosphere.

11. A method of manufacturing a semiconductor device, comprising the steps of:

(a) preparing a semiconductor substrate;

(b) selectively forming a gate structure on a main surface of said semiconductor substrate;

(c) forming extension regions which are paired with said gate structure interposed therebetween in said main surface of said semiconductor substrate; and (d) forming semiconductor layers in which an impurity for lowering resistance is introduced on said extension regions, wherein said step (d) includes the step of (d-1) forming epitaxial growth layers on said extension regions.

12. The method of manufacturing a semiconductor device according to claim 11, further comprising the steps of:

(e) introducing hydrogen ions or deuterium ions into an interior of at least one of said semiconductor layers; and (f) forming metal-semiconductor compound layers on said semiconductor layers after said step (e).

13. The method of manufacturing a semiconductor device according to claim 12, wherein said step (d) has the steps of:
(d-1) forming epitaxial growth layers on said extension regions; and
(d-2) introducing an impurity into said epitaxial growth layers to form said semiconductor layers,
said method further comprising the step of:
(x) performing a heat treatment after said step (d-1).

14. The method of manufacturing a semiconductor device according to claim 11, further comprising the steps of:

(g) forming sidewalls in contact with side surfaces of said gate structure after said step (d); and (h) ion-implanting an impurity into said semiconductor substrate with said gate structure and said sidewalls used as an implantation mask to form source/drain regions.

15. The method of manufacturing a semiconductor device according to claim 14, wherein said semiconductor layers having impurity concentration higher than that of said extension regions are formed in said step (d), and said source/drain regions having impurity concentration higher than that of said semiconductor layers are formed in said step (h).

16. The method of manufacturing a semiconductor device according to claim 1, wherein in said step (d) the hydrogen ions or deuterium ions are introduced into the interior of said semiconductor film by ion implantation.

17. The method of manufacturing a semiconductor device according to claim 6, wherein in said step (d) the hydrogen ions or deuterium ions are introduced into the interior of said semiconductor substrate by ion implantation.

* * * * *